(12) United States Patent
Ichiyanagi et al.

(10) Patent No.: US 7,332,231 B2
(45) Date of Patent: *Feb. 19, 2008

(54) CERAMIC SUBSTRATE FOR THIN FILM ELECTRONIC COMPONENT, PRODUCTION METHOD FOR THE SAME AND THIN FILM ELECTRONIC COMPONENT USING THE SAME

(75) Inventors: Seiji Ichiyanagi, Aichi (JP); Jun Otsuka, Aichi (JP); Manabu Sato, Aichi (JP)

(73) Assignee: NGK Spark Plug Co., Ltd., Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 10/958,569

(22) Filed: Oct. 6, 2004

(65) Prior Publication Data

US 2005/0074627 A1    Apr. 7, 2005

(30) Foreign Application Priority Data

Oct. 6, 2003   (JP)   ............................. 2003-347539

(51) Int. Cl.
   *C03C 27/00* (2006.01)
   *B32B 5/14* (2006.01)
(52) U.S. Cl. .................. 428/631; 428/142; 428/210; 428/307.3; 428/901; 361/762; 361/763; 430/313
(58) Field of Classification Search ........ 361/762–763; 428/446, 210, 142, 307.7, 631; 430/313
   See application file for complete search history.

(56) References Cited

U.S. PATENT DOCUMENTS 4,396,682 A * 8/1983 Mohri et al. ................. 428/428
4,634,634 A * 1/1987 Kondo et al. ................ 428/432
4,767,672 A * 8/1988 Fujinaka et al. ............ 428/446
4,806,334 A * 2/1989 Fujinaka et al. ............ 428/631
6,320,738 B1 * 11/2001 Yamana et al. ........... 361/321.2

FOREIGN PATENT DOCUMENTS

JP    2001-44073 A    2/2001
JP    2003-017301 A   1/2003

* cited by examiner

*Primary Examiner*—Cathy F. Lam
(74) *Attorney, Agent, or Firm*—Sughrue Mion, PLLC

(57) ABSTRACT

A ceramic substrate for a thin film electronic component, a production method thereof, and a thin film electronic component using the ceramic substrate A first substrate (1) includes a dense glass-ceramic mixed layer (33) containing glass in its surface portion. A second substrate is prepared such that a glass layer (32) formed on a surface of a substrate base portion (2) is subjected to a heat-pressure treatment so as to form or rather partly change the glass portion (32) into a dense glass-ceramic mixed layer (33) in which glass is dispersed into a surface portion of the substrate base portion (2). A surface of the dense glass-ceramic mixed layer (33) is then subjected to grinding or rather polishing to flatten and expose a surface of the dense glass-ceramic mixed layer (32). A third substrate includes a substrate base portion (2) having a dense glass-ceramic mixed layer (33) containing glass on a surface portion in one face side, and a wiring pattern (21) formed inside the substrate base portion (2). In the wiring pattern (21), one end thereof is exposed on or from a surface of the dense glass-ceramic mixed layer (33) and the other end is exposed on or from another surface of the substrate.

11 Claims, 16 Drawing Sheets

CERAMIC SUBSTRATE FOR THIN FILM ELECTRONIC COMPONENT, PRODUCTION METHOD FOR THE SAME AND THIN FILM ELECTRONIC COMPONENT USING THE SAME

BACKGROUND OF THE INVENTION

1. Field of Invention

The present invention relates to a ceramic substrate for a thin film electronic component, a method for producing the ceramic substrate for a thin film electronic component, and a thin film electronic component using the same. Particularly, the invention relates to a ceramic substrate for use in a thin film electronic component which requires a high degree of flatness, a method for producing the ceramic substrate and a thin film electronic component using the ceramic substrate.

2. Description of the Related Art

In recent years, thin film electronic components such as a small size thin film capacitor of a large capacity have been in demand. In these thin film electronic components such as a thin film capacitor, it is necessary to reduce the thickness of a conductor layer and a dielectric layer to the extent possible. In this regard, a thin film forming technique such as a sputtering method, a CVD method or a sol/gel method has mainly been used. However, formation of the thin layer is influenced to a great extent by surface features of the base substrate. When the surface of the substrate is not sufficiently flat, various problems arise such that the desired characteristics can not be obtained, insulation between conductor layers can not be attained in a satisfactory manner and the like. As for such substrates having a flat surface of particularly high precision, as described in the patent publications below, a glazed substrate prepared by performing glass-coating a surface of a ceramic substrate has been known.

[Patent Document 1] JP-A No. 2001-044073; and
[Patent Document 2] JP-A No. 2003-017301.

PROBLEMS TO BE SOLVED BY THE INVENTION

Patent Document 1 describes that, in order to enhance flatness, a flattening film such as a glass coating may be deposited. Similarly, Patent Document 2 describes that a flat face can be obtained by using a glazed alumina substrate. However, in a conventional glazed ceramic substrate, as also described in Patent Document 2, even when an alumina substrate having a high purity of 99.5% or more is used, an arithmetic average roughness Ra of the surface of the glazed ceramic substrate is about 30 nm at the lowest. Considering recent requirements for the thin film electronic component, a flat surface having a higher precision is required; however, it is difficult to comply with such requirement by a conventional technique.

SUMMARY OF THE INVENTION

The invention has been achieved under these circumstances, and it is an object of the present invention to provide a ceramic substrate for a thin film electronic component in which a flat face of particularly high precision can be obtained in a sure and easy manner and, further, at low cost, a method for producing the ceramic substrate for a thin film electronic component and a thin film electronic component using the same.

In conducting studies on a glazed substrate, the present inventors have found that when a glass layer is subjected to a heat-pressure treatment, a characteristic mixed layer which contains ceramic and glass is formed at an interface between a ceramic substrate and the glass layer. Further, the present inventors have found that an inexpensive general-purpose substrate which has a large surface roughness containing a pore specific to the ceramic substrate, and which accordingly is difficult to use for a thin film electronic component as is, can be employed when processed according to the invention. Namely, the present inventors have found that when a general-purpose substrate is used, the pore is not observed in a dense glass-ceramic mixed layer formed by a synergistic effect of the glass dispersed inside the ceramic of the substrate, which functions as a sintering aid, and pressurization at the time of the heat-pressure treatment. The invention has been achieved based on these findings.

Namely, the above object of the present invention has been achieved by providing:

(1) a ceramic substrate for a thin film electronic component (hereinafter, also referred to as "a ceramic substrate for a thin film electronic component according to a first aspect of the invention"), comprising a ceramic substrate base portion, having a dense glass-ceramic mixed layer containing glass in a surface portion thereof;

(2) a ceramic substrate for a thin film electronic component (hereinafter, also referred to also as "a ceramic substrate for a thin film electronic component according to a second aspect of the invention"), prepared by subjecting a glass layer formed on a surface of a ceramic substrate base portion to heat-pressure treatment to form a dense glass-ceramic mixed layer in which glass is dispersed in a surface portion of the ceramic substrate base portion, and then polishing the thus-formed dense glass-ceramic mixed layer for flattening the same, to thereby expose a surface thereof;

(3) the ceramic substrate for a thin film electronic component as described in (2) above, in which the heat-pressure treatment is performed at 700° C. or higher under a pressure of 1 MPa or higher;

(4) the ceramic substrate for a thin film electronic component as described in (2) or (3) above, wherein the glass constituting the glass layer has a softening point of 750° C. or more;

(5) the ceramic substrate for a thin film electronic component as described in any one (2) to (4) above, wherein the glass constituting the glass layer has a yield point of 700° C. or more;

(6) the ceramic substrate for a thin film electronic component as described in any one of (2) to (5) above, wherein the glass constituting the aforementioned glass layer comprises, as main components, Si, Al, B, Ca and O;

(7) the ceramic substrate for a thin film electronic component as described in any one of (1) to (6) above, further comprising an interior wiring pattern;

(8) the ceramic substrate for a thin film electronic component as described in any one of (1) to (7) above, wherein glass is not contained in remaining portions exclusive of the dense glass-ceramic mixed layer of the ceramic substrate base portion, or glass is contained in remaining portions exclusive of the dense glass-ceramic mixed layer of the ceramic substrate base portion and, further, an amount of glass contained in the remaining portions is smaller than the amount of glass contained in the dense glass-ceramic mixed layer;

(9) the ceramic substrate for the thin film electronic component as described in any one of (1) to (8) above, wherein the dense glass-ceramic mixed layer does not have a pore;

(10) a ceramic substrate for a thin film electronic component (hereinafter, also referred to as "a ceramic substrate for a thin film electronic component according to a third aspect of the invention"), comprising a ceramic substrate base portion having a dense glass-ceramic mixed layer containing glass in a surface portion at least in one face side thereof and a wiring pattern formed inside the ceramic substrate base portion, wherein one end of the wiring pattern is exposed at a surface of the dense glass-ceramic mixed layer among surfaces of the ceramic substrate for a thin film electronic component and the other end of the wiring pattern is exposed on another surface of the ceramic substrate for a thin film electronic component;

(11) a thin film electronic component, being comprising the ceramic substrate for a thin film electronic component as described in any one of (1) to (10) above;

(12) the thin film electronic component as described in (11) above, further comprising a capacitor portion in which conductor layers for the capacitor and a dielectric layer for the capacitor are alternatingly laminated on the aforementioned ceramic substrate for a thin film electric component, such that the dielectric layer for the capacitor is interposed between two opposing conductor layers for the capacitor; and

(13) a method for producing a ceramic substrate for a thin film electronic component, comprising, in the stated order, the steps of:

forming a glass layer on a surface of a ceramic substrate base portion having an interior wiring pattern with one end of the interior wiring pattern being exposed on the surface of the ceramic substrate base portion;

performing a heat-pressure treatment on the glass layer so as to form or rather partly change the glass layer into a dense glass-ceramic mixed layer from which glass is dispersed into a surface portion of the ceramic substrate base portion; and polishing the thus-formed dense glass-ceramic mixed layer for flattening the same, to thereby expose the dense glass-ceramic mixed layer and the interior wiring pattern.

EFFECTS OF THE INVENTION

Since a ceramic substrate for a thin film electronic component according to a first aspect of the invention has a flat face of high precision, a thin film electronic component of high reliability can consistently be obtained. Further, a thin film electronic component of high reliability can be obtained at low cost.

Since a ceramic substrate for a thin film electronic component according to a second aspect of the invention has a flat face of high precision, a thin film electronic component of high reliability can consistently be obtained. Further, the thin film electronic component of high reliability can be obtained at low cost.

When the heat-pressure treatment is performed at 700° C. or higher under a pressure of 1 MPa or higher, a flat face of particularly high precision can be obtained and, then, a thin film electronic component of high reliability can consistently be obtained.

When a softening point of glass constituting the glass layer is 750° C. or higher, a flat face of particularly high precision can be obtained and, then, a thin film electronic component of high reliability can consistently be obtained. Further, at an operational temperature which is applied at the time of forming the thin film electronic component using the glass layer, flatness can be maintained and, then, a thin film electronic component of high reliability can consistently be obtained.

When a yield point of glass constituting the glass layer is 700° C. or higher, a flat face of particularly high precision can be obtained and, then, the thin film electronic component of high reliability can consistently be obtained. Further, at the operational temperature which is applied at the time of forming the thin film electronic component using the glass layer, flatness can be maintained and, then, a thin film electronic component of high reliability can consistently be obtained.

When glass constituting the glass layer comprises, as main components, Si, Al, B, Ca and O, the flat face of particularly high precision can be obtained and, further, a conductor layer can be formed directly on a glaze face and, then, a thin film electronic component of high reliability can consistently be obtained.

A wiring pattern inside the ceramic substrate for a thin film electronic component contributes to down-sizing such that, for example, another electronic component can be mounted thereon.

When glass is not contained in remaining portions exclusive of the dense glass-ceramic mixed layer in ceramic portions of the ceramic substrate base portion, or even when glass is contained therein, in an amount smaller than the amount of glass contained in the dense glass-ceramic mixed layer, sufficient mechanical strength of the ceramic substrate for a thin film electronic component can be obtained.

When the dense glass-ceramic mixed layer does not have a pore, it has a flat face of particularly high precision and, then, a thin film electronic component of high reliability can consistently be obtained. Further, a thin film electronic component of high reliability can be obtained at low cost.

Since the ceramic substrate for a thin film electronic component according to a third aspect of the invention has a flat face of high precision, a thin film electronic component of high reliability can consistently be obtained. Further, a thin film electronic component of high reliability can be obtained at low cost.

Since a thin film electronic component according to the invention comprises the substrate having a flat face of high precision, it has excellent precision and reliability.

According to the thin film electronic component comprising a predetermined capacitor portion on the ceramic substrate for the thin film electronic component of the invention, consistent electric characteristics can be obtained, no short circuits are generated and a capacitor function of high reliability can be obtained.

According to a method of producing the ceramic substrate for the thin film electronic component of the invention, the ceramic substrate for the thin film electronic component having a flat face of high precision can be obtained in a reliable and easy manner.

DESCRIPTION OF REFERENCE NUMERALS

Figure 1:
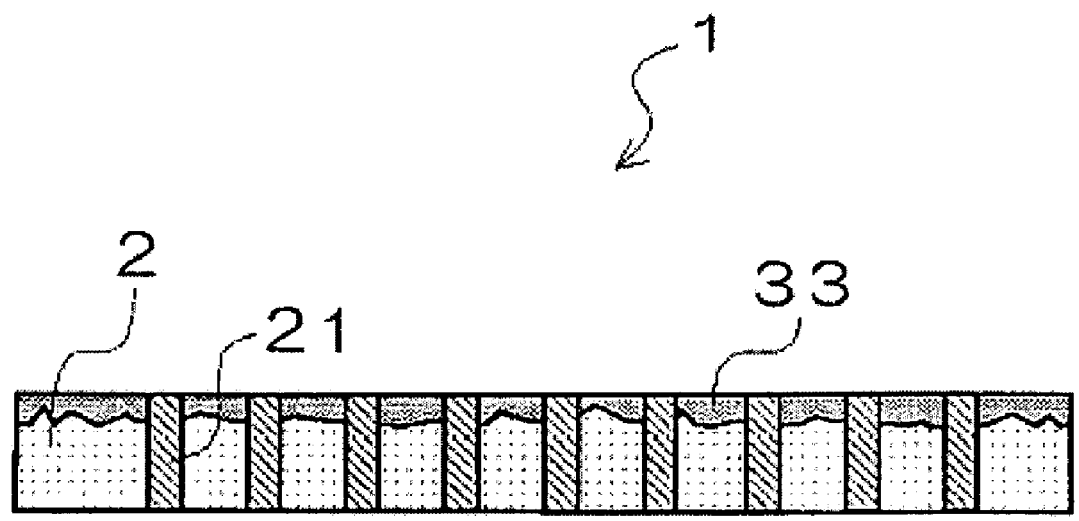
FIG. 1 is a cross-sectional diagram schematically showing a cross-section of a ceramic substrate for a thin film electronic component according to the invention.

Reference numerals used to identify various structural elements shown in the drawings include:
1 ceramic substrate for thin film electronic component
2 ceramic substrate base portion
21 wiring pattern (via conductor)
22 pore
31 glass paste layer
32 glass layer
321 void
33 dense glass-ceramic mixed layer
34 glaze layer
100 thin film capacitor (thin film electronic component)
4 conductor layer for capacitor
4a conductor top layer for capacitor
4b conductor bottom layer for capacitor
5 etching resist (for conductor layer)
51 photoresist layer (for conductor layer)
6 dielectric layer for capacitor (dielectric raw material)
7 etching resist (for dielectric layer)
8 conductor layer for capacitor
8a conductor top layer for capacitor
8b conductor bottom layer for capacitor
9 etching resist (for conductor layer)
10 solder resist layer
11 nickel-gold plated layer
12 solder ball
13 $SiO_2$ layer
14 conductor layer for capacitor
15 resist layer
16 resist layer
17 solder ball connection pattern

DESCRIPTION OF THE PREFERRED EMBODIMENTS

Hereinafter, the invention will be described in greater detail. However, the present invention should not be construed as being limited thereto.

[1] Ceramic Substrate for Thin Film Electronic Component

A ceramic substrate for a thin film electronic component according to a first aspect of the invention comprises a ceramic substrate base portion having a dense glass-ceramic mixed layer containing glass in a surface portion thereof.

The aforementioned "ceramic substrate base portion" means a ceramic substrate which becomes a base portion of the ceramic substrate for a thin film electronic component. It further means a substrate having a dense glass-ceramic mixed layer described below on a surface portion thereof. This ceramic substrate for the base portion may be composed of one layer or two or more layers and may or may not comprise an interior wiring pattern.

A ceramic component which constitutes the ceramic substrate base portion is not particularly limited and is preferably selected to have excellent thermal resistance and mechanical strength. As for a ceramic component which is predominant among such ceramic components (hereinafter, also referred to as "main ceramic component" and is ordinarily contained in an amount of 40% by mass or more based on the entire mass), alumina, zirconia, silica, magnesia or the like may be used. Among these, alumina is preferred. This is because alumina has excellent insulating property, thermal resistance, mechanical strength, thermal stability and the like, is highly versatile and can be obtained at low cost.

When alumina is contained as the main ceramic component, the content thereof is not particularly limited and is preferably 40% by mass or more (more preferably 70 to 99% by mass, further more preferably 85 to 98% by mass) based on 100% by mass of an entire ceramic portion exclusive of the dense glass-ceramic mixed layer and also an inner wiring pattern when it is provided. When the content thereof is 40% by mass or more, the aforementioned characteristics imparted by alumina can be sufficiently realized.

Further, as an auxiliary ceramic component apart from the main ceramic component (ordinarily, contained in an amount of less than 40% by mass based on the entire mass), magnesia, calcia, silica, boric acid or the like can be contained. However, the main ceramic component and the auxiliary ceramic component are different from each other. Further, ceramic components derived from, for example, a sintering aid other than the main ceramic component and the auxiliary ceramic component may be contained. One type or two types or more of each of the main ceramic component, the auxiliary ceramic component and other ceramic components may be contained.

Further, as for a basic substrate (substrate before a dense glass-ceramic mixed layer is formed thereon) which constitutes the ceramic substrate base portion, various substrates may be used without particular limitation. Namely, for example, a ceramic substrate, a glass-ceramic substrate and other appropriate substrates can be used. Among these substrates, a ceramic substrate base portion is preferred in which glass is not contained in remaining portions exclusive of the dense glass-ceramic mixed layer, or even when glass is contained therein, the amount of glass is smaller than the amount of glass contained in the dense glass-ceramic layer. When glass is contained in this basic substrate (the aforementioned remaining portion after the mixed layer is formed), an amount of glass is, based on 100% by volume of the entire remaining portion (a portion remaining after subtracting the mixed layer from the ceramic substrate for the base portion), preferably 40% by volume or less (more preferably 20% by volume or less and still more preferably 15% by volume or less). Further, compared with glass contained in the ceramic substrate base portion, glass constituting the mixed layer preferably has a high yield point (for example, preferably higher by 100° C. or more) and, further, particularly preferably has a high softening point (for example, preferably higher by 100° C. or more). By incorporating these features, even when the substrate is used as a substrate for a capacitor, a thin film electronic component which can withstand a high temperature production process, and which exhibits sufficient mechanical strength and has a high durability, can be obtained.

The aforementioned "dense glass-ceramic mixed layer" (hereinafter, also referred to as a "mixed layer") denotes a surface portion of the ceramic substrate base portion and, also, a layer which is prepared by allowing glass to be contained in a portion consisting only of ceramic constituting the ceramic substrate base portion (hereinafter also referred to as "ceramic portion of base portion") and is then densified. The amount of glass contained therein is ordinarily 0.1% by mass or more. Further, although depending on the aforementioned ceramic components and glass components described below, it is preferably from 0.5 to 50% by mass (more preferably from 2 to 50% by mass). Particularly, when the aforementioned main ceramic component is alumina, the amount of glass contained in the mixed layer is preferably from 0.2 to 30% by mass (more preferably from 0.5 to 30% by mass and still more preferably from 2 to 30% by mass).

Further, a dense state means a state in which a pore is not observed on a surface (when polishing is performed, a surface after being subjected to that polishing) and an ordinarily maximum height Ry of the surface is 0.25 μm or less.

Still further, the mixed layer has no pore. Having no pore means a state in which a pore having a major axis of 0.2 μm or more is not observed in at least 10 arbitrary areas each having a 100 μm square in cross-section in the laminate direction. Namely, the mixed layer is an extremely dense layer which does not have a pore inside the mixed layer. In this regard, "cross-section in a direction of the laminate" denotes a cross-section perpendicular to a direction in which the mixed layer is laminated on the ceramic substrate base portion and "observation" is conducted on an image ordinarily having 2000 magnifications or more.

Further, the surface roughness of the mixed layer thus exposed is not particularly limited; however, it preferably has an arithmetic average roughness Ra of 0.02 μm or less and a maximum height Ry of 0.25 μm or less. Still further, Ra may be 0.015 μm or less and Ry may be 0.25 μm or less and, particularly, Ra may be 0.010 μm or less and Ry may be 0.20 μm or less. These extremely flat surface states can ordinarily be obtained by polishing. Notably, (Ra) and (Ry) are defined and measured, as specified in JIS B0601 (1994), incorporated herein by reference.

The mixed layer may be formed on one face of the ceramic substrate base portion or may be formed on both faces of the ceramic substrate base portion.

The thus-formed dense mixed layer can ordinarily be obtained by subjecting the ceramic substrate base portion having a glass layer formed on a surface thereof (basic substrate) to heat-pressure treatment.

The glass constituting the mixed layer is not particularly limited and is preferably selected so as to have excellent thermal resistance, insulating property and mechanical strength. As for glass components constituting the glass, ordinarily, at least Si, Al and O are contained in the glass. Further, as for other elements, B, Ca, Mg, Sr, Ba, V, Cr, Mn, Co, Ni, Ga, Y, Zr, Nb, Mo, Tc, In, Sn, Ta, W, Re, Bi, each lanthanoid, each actinoid and the like can be contained therein. Among these other elements, B, Ca, Mg, Ba and the like are preferable, and B and Ca are more preferable. These other elements may be contained either alone or in combination of two types or more thereof. These elements may be contained in the form of a complex oxide comprising two types or more of metallic elements among the aforementioned elements. On the other hand, the glass constituting the mixed layer preferably does not substantially contain an alkaline metal element, P, Pb and the like. Further, when glass particularly excellent in insulating property is prepared, the glass preferably also does not contain a transition element among the aforementioned elements.

Particularly, the glass preferably contains Si, Al, B, Ca and O as main components. Namely, when an entire glass constituting the mixed layer is regarded as 100% by mass, an entire amount of Si in terms of $SiO_2$, Al in terms of $Al_2O_3$, B in terms of $B_2O_3$ and Ca in terms of CaO contained therein is preferably 80% by mass or more (more preferably 90% by mass or more, still more preferably 95% by mass or more).

Further, when the entire glass is regarded as 100% by mass, the glass can contain 50 to 70% by mass (more preferably 55 to 65% by mass) of Si in terms of $SiO_2$ and 3 to 15% by mass (more preferably 5 to 10% by mass) of Al in terms of $Al_2O_3$, and additionally, 10 to 30% by mass (more preferably 15 to 25% by mass) of B in terms of $B_2O_3$ and 3 to 20% by mass (more preferably 5 to 15% by mass) of Ca in terms of CaO.

The transition point of the glass is not particularly limited and is preferably 600° C. or higher (more preferably 630° C. or higher and ordinarily 700° C. or lower).

Further, the softening point of this glass is not particularly limited and is preferably 750° C. or higher (more preferably 800° C. or higher and ordinarily 1200° C. or lower). An operational temperature which is applied at the time of producing the thin film electronic component using the present ceramic substrate for a thin film electronic component is ordinarily about 700° C. to the maximum. In this regard, so long as the softening point is 750° C. or higher, flatness of the surface of the mixed layer can sufficiently be maintained.

Further, the yield point of the glass is not particularly limited and is preferably 700° C. or higher (more preferably 750° C. or higher, further 800° C. or higher and ordinarily 1000° C. or lower). An operational temperature which is applied at the time of producing the thin film electronic component using the present ceramic substrate for a thin film electronic component is ordinarily about 700° C. to the maximum. In this regard, so long as the yield point is 700° C. or higher, flatness of the surface of the mixed layer can be sufficiently maintained. Namely, such yield point as described above is particularly appropriate in a case in which a process in which glass constituting the mixed layer is heated at 700° C. or higher is included in a post-process. Examples of such processes include a capacitor forming process to be performed using a sol/gel method. That is, for example, a glass having a yield point of 700 to 800° C. can be used.

Further, the shape and size of the mixed layer is not particularly limited. Still further, the thickness thereof is also not particularly limited and is preferably 100 µm or less (more preferably 70 µm or less, still more preferably 50 µm or less and ordinarily 10 µm or more). The mixed layer is in a state of being deformed or distorted more easily than other portions of the ceramic substrate base portion in the heat-pressure treatment. So long as the thickness thereof is in the aforementioned range, even when an interior wiring pattern is provided, the dimensional precision of the wiring pattern in a plane direction can sufficiently be maintained in the heat-pressure treatment. Further, although a surface of the mixed layer is ordinarily polished so as to flatten the same, the mixed layer may be thick to the extent that the ceramic portion of the base portion is not exposed by this polishing. Ordinarily, taking polishing precision into consideration, the mixed layer should have a thickness of 10 µm or more.

The surface of the mixed layer is ordinarily polished so as to flatten the same. The polishing method is not particularly limited and the surface roughness thereof can effectively be reduced by polishing. As for the surface roughness of the mixed layer, its arithmetic average roughness Ra can be 0.02 µm or less (further, 0.015 µm or less, particularly 0.010 µm or less). Further, its maximum height Ry can be 0.25 µm or less (further, 0.20 µm or less). Still further, Ra and Ry can simultaneously be 0.02 µm or less and 0.25 µm or less, respectively (further, Ra and Ry can simultaneously can be 0.015 µm or less and 0.25 µm or less, respectively and, particularly Ra and Ry can simultaneously be 0.010 µm or less and 0.20 µm or less, respectively).

The present ceramic substrate for a thin film electronic component can comprise an interior wiring pattern. The "wiring pattern" is formed at least inside the present ceramic substrate for a thin film electronic component. As for the wiring pattern described above, a via wiring formed in the ceramic substrate for a thin film electronic component may be used (refer to 21 in FIGS. 1 and 7). The via wiring is a wiring pattern which electrically conducts between a surface side of the ceramic substrate for a thin film electronic component and a rear surface side thereof. The electrically conductive material constituting this via wiring is not particularly limited and, for example, tungsten, molybdenum, gold, platinum, silver, palladium, copper and nickel can be used. These electrically conductive materials may be used either alone or in combination of two types or more thereof.

Further, the shape of the via wiring is not particularly limited, and ordinarily is in the shape of a column which passes through all layers in the laminate direction. Still further, the via diameter is not particularly limited and can, for example, be 50 to 200 µm.

Further, besides the aforementioned via wiring, a wiring pattern formed in a plane direction in the same manner as in an electrode layer constituting the thin film electronic component can be provided. Namely, for example, an ordinary wiring for electric conduction, a wiring for resistance, a wiring for induction and a bonding pad can be used.

A ceramic substrate for a thin film electronic component according to a second aspect of the invention is characterized in that a glass layer formed on a surface of a ceramic substrate base portion is subjected to a heat-pressure treatment to form a dense glass-ceramic mixed layer in which glass is dispersed in a surface portion of the ceramic substrate base portion and then, the thus-formed dense glass-ceramic mixed layer is subjected to polishing so as to flatten the same, and to thereby expose a surface of the mixed layer.

The aforementioned "ceramic substrate base portion" can be the same as employed in the above first aspect. Further, the surface roughness of the ceramic substrate base portion prior to forming the mixed layer is not particularly limited, so long as its maximum height Ry is smaller than the thickness of the mixed layer (ordinarily, the thickness of the mixed layer after polishing). The thickness of the mixed layer, as described below, can be varied in accordance with processing conditions at the time of the heat-pressure treatment, the glass component to be used and the like. In this regard, depending on the surface roughness of the ceramic substrate base portion to be used, the processing conditions to be applied, the glass component to be used and the like, Ry of the ceramic substrate base portion can be adjusted to be smaller than the thickness of the mixed layer. For example, when the thickness of the mixed layer is 50 µm, Ry of the surface of the ceramic substrate base portion may be less than 50 µm.

Further, irrespective of this surface roughness, a sintered ceramic substrate may be used as the ceramic substrate for the base portion as. However, it is preferable to use the substrate after it is polished to level the surface thereof to such an extent as irregularities caused by a curl or the like specific to ceramic are removed and to the extent that the substrate assumes a flat surface.

Still further, the shape and size of the ceramic substrate base portion prior to forming the mixed layer are not particularly limited. Although the thickness thereof is not particularly limited, the thickness of the ceramic substrate base portion is ordinarily 200 µm or more (preferably from 200 to 2000 µm and more preferably from 300 to 1000 µm). So long as it is 200 µm or more, the ceramic substrate for a thin film electronic component can be imparted with sufficient mechanical strength.

The "dense glass-ceramic mixed layer" according to the first aspect can be used as the aforementioned "mixed layer" without modification.

The aforementioned "glass layer" is a layer comprising glass which has not been subjected to the heat-pressure treatment. This glass layer has a pore on a surface and, ordinarily, further has an internal void (same meaning as pore). The glass layer is different from a glaze layer which has been subjected to the heat-pressure treatment described below and has no pore on a surface.

Glass constituting the glass layer can be the same "glass constituting the mixed layer" of the ceramic substrate for a thin film electronic component according to the first aspect without modification. Further, the shape and size of the glass layer is not particularly limited. The thickness thereof is also not particularly limited. Any layer is permissible so long as an amount of glass sufficient to form a desired (with respect to thickness and the like) mixed layer is contained therein. For example, the thickness thereof can be from 1 to 300 µm. When a mixed layer of 50 µm is formed, the thickness of the glass layer after firing is preferably 10 µm or more. The method for forming the glass layer is not particularly limited and, for example, the glass layer can be obtained by firing a layer containing glass powder described below.

The term "firing" as used herein means heating a layer containing the glass powder up to a temperature of a softening point or more of glass constituting the glass powder such that the glass becomes stratified. Such firing temperature is appropriately set depending on the composition of glass to be used. For example, in glass having a softening point of from about 750 to about 1000° C., the firing temperature is preferably from 800 to 1200° C. (more preferably from 900 to 1100° C.). The firing atmosphere is also not particularly limited and is preferably appropriately selected depending on a conductor material or the like constituting the inner wiring pattern to be contained in the ceramic substrate base portion. Namely, for example, when the conductor material comprises, as main components, gold and platinum, the firing is preferably performed in an atmospheric environment, while, when the conductor material comprises, as main components, easily oxidizable conductor materials such as copper, nickel, tungsten and molybdenum, the firing is preferably performed in a non-oxidative atmosphere.

The shape, a size and thickness of the layer containing glass powder are not particularly limited. The glass powder contained in the layer is a powder comprising the "glass constituting the mixed layer" of the ceramic substrate for a thin film electronic component according to the first aspect. The shape of this powder is not particularly limited. The size thereof is also not particularly limited, and powder having an average particle size of 0.1 to 100 µm is ordinarily used. So long as the particle size of the powder is in such range as described above, the powder is easily softened and workability thereof is favorable.

A method for forming the layer containing this glass powder is not particularly limited. For example, the layer can be obtained by applying a paste containing glass powder (hereinafter, also referred to as "glass paste"). Further, the layer can be obtained such that the ceramic substrate for the base portion is placed in a slurry in which glass powder is dispersed to allow glass powder to precipitate and deposit thereon. Then, the resultant ceramic substrate is removed from the slurry and thereafter dried. Further, the layer can be obtained such that the glass powder is directly sprinkled to form a layer comprising only the glass powder. Among these methods, the method of obtaining the layer by applying a glass paste is preferred from the standpoint of workability.

When the glass paste is used, besides the glass powder, an organic component is ordinarily contained in the glass paste. The organic component mainly imparts the glass paste with a forming property and the like. A binder is ordinarily included in such organic components. Useful binders include ethyl cellulose-type resin, butyral-type resin, acrylic resin and the like. These binders may be used either alone or in combination of two types or more thereof. Other components such as a plasticizer, a dispersant, a solvent or the like can be used. These components may be contained alone or in combination of two types or more thereof. Further, the glass paste can contain a dispersant, a leveling agent, a slipping agent, a defoamer, an antioxidant or the like, irrespective of being an inorganic component or an organic component. These components may be contained either alone or in combination of two types or more thereof.

The viscosity of the glass paste is not particularly limited, and can be set from 1 to 1000 Pa·s (more preferably from 20 to 500 Pa·s).

The method for applying the glass paste is not particularly limited, and is appropriately selected depending on viscosity, a state and the like of the glass paste. For example, when the viscosity of the glass paste is from 1 to 1000 Pa·s, the glass paste can be applied by a screen printing method, a doctor blade method, a curtain coater printing method or the like. Among these methods, the screen printing and doctor blade methods are preferred. Further, when the viscosity is lower than the minimum value of the viscosity range described above, application thereof can be performed by a spin coat, a dip coat, a spray coat (inclusive of an inkjet method, a thermal method and the like) and the like.

The aforementioned "heat-pressure treatment" is a treatment of applying pressure on the glass layer while heating. The mixed layer is formed by this heat-pressure treatment. Forming the mixed layer means a case in which, for example, when glass starts to be dispersed in the ceramic substrate base portion at the time of firing, the glass-ceramic mixed layer which has not yet densified is subjected to the heat-pressure treatment to become a dense glass-ceramic mixed layer. Further, by such treatment, a larger amount of glass that can not otherwise be dispersed by firing alone can be dispersed in the ceramic substrate base portion and, further, the amount of glass contained in the resultant mixed layer and the thickness of the mixed layer can be adjusted. When firing is not performed, the mixed layer is directly formed from the glass paste layer or the like without taking a route of forming the glass layer.

After the heat-pressure treatment is performed, ordinarily only a portion of the glass layer is dispersed in the ceramic and remaining portions thereof are left on the mixed layer as a glaze layer. The glaze layer denotes a layer in which the glass layer is made dense by being subjected to the heat-pressure treatment. Namely, it is a dense glaze layer which is denser than conventionally known glaze layers. The term "dense" as used herein means a state in which a pore is not present on an outermost surface of the glaze layer (ordinarily, this is the outermost surface after being polished) at all. In such manner as described above, the glaze layer is ordinarily formed on the mixed layer and, then, as described below, the glaze layer is removed by polishing to flatten the same, and to thereby expose the surface of the mixed layer.

A heating method and a pressurizing method in this heat-pressure treatment are not particularly limited. For example, either isotropic pressurization or uniaxial pressurization can be used. Further, as for a pressurization medium, any one of gas, powder and liquid can be used. Among these pressurization methods, isotropic pressurization is preferred while gas is preferred as the pressurization medium. As for the methods described above, a hot isostatic press method (hereinafter, also referred to as "HIP method") can be used.

Further, when glass is subjected to the heat-pressure treatment, although the heat-pressure treatment may be performed on the glass layer in a nearly solidified state, it is preferable to preheat the glass layer to a state having fluidity. By allowing the glass layer to be in a state having fluidity, it becomes possible to effectively remove voids from inside the glass layer. Being in a state having fluidity denotes a state in which glass constituting the glass layer is heated at a temperature (this temperature is "a temperature of $T_{-50}$ or more") higher than a temperature which is lower than a softening point by 50° C. (this temperature is defined as "$T_{-50}$") of glass constituting the glass layer.

When the layer containing the aforementioned glass powder is used, such preheating prior to the heat-pressure treatment may be performed continuously with a step in which the layer containing the glass powder is fired to be the glass layer or may be carried out separately. Further, the preheating may be performed continuously with the heat-pressure treatment or carried out separately therefrom.

The heating temperature in the heat-pressure treatment is not particularly limited. An appropriate temperature is preferably set depending on the characteristics of glass to be used, the thickness of the mixed layer to be attained and the like and is ordinarily 700° C. or higher (preferably from 800 to 1200° C. and more preferably from 850 to 1100° C.). Further, the pressure to be applied is not particularly limited. An appropriate pressure is preferably set depending on the characteristics of glass to be used, the thickness of the mixed layer to be attained and the like and is ordinarily 1 MPa or higher (preferably from 1 to 200 MPa and more preferably from 5 to 100 MPa). Still further, the heating temperature and the pressure to be applied are preferably 700° C. or higher and 1 MPa or higher, respectively; and more preferably from 800 to 1200° C. and from 1 to 200 MPa, respectively; and still more preferably from 850 to 1100° C. and from 5 to 100 MPa, respectively.

Furthermore, a period of time in which the heat-pressure treatment is performed is not particularly limited and is ordinarily 3 minutes or more and can be 120 minutes or less (further 60 minutes or less and particularly 30 minutes or less). Although it is possible to perform the treatment for a longer period of time, it is considered that the mixed layer is ordinarily formed in a relatively short period of time.

The aforementioned "polishing for flattening" denotes polishing the mixed layer formed by the heat-pressure treatment in a flattening manner to allow a surface thereof to be exposed. As described above, since the glaze layer is ordinarily formed on the mixed layer, by removing this glaze layer, a surface of the mixed layer can be exposed. Further, after the surface of the mixed layer is exposed, even when the glaze layer remains on a portion of the surface, there is no problem. This is because there is a case in which a flat surface as a whole may sometimes be obtained with the remaining glaze layer. The glaze layer is dense, since it has been subjected to the heat-pressure treatment as described above and, therefore, a flat face having a high precision can be obtained by polishing.

The polishing method in the polishing for flattening is not particularly limited and may be mechanical polishing, chemical-mechanical polishing or chemical polishing. Among these methods, mechanical polishing and chemical-mechanical polishing are preferred.

The ceramic substrate for an electronic component according to the present third aspect, comprising a ceramic substrate base portion comprising a dense glass-ceramic mixed layer containing glass in a surface portion at least in one face side thereof and a wiring pattern formed inside the ceramic substrate base portion, is characterized in that one end of the wiring pattern is exposed on a surface of the dense glass-ceramic mixed layer among surfaces of the present ceramic substrate for a thin film electronic component and the other end of the wiring pattern is exposed on another surface of the present ceramic substrate for the thin film electronic component.

The aforementioned "ceramic substrate base portion" and "mixed layer" can be the same as used in the ceramic substrate for a thin film electronic component according to the first aspect.

As for the aforementioned "wiring pattern", one end thereof is exposed on a surface of the dense glass-ceramic mixed layer among surfaces of the present ceramic substrate for a thin film electronic component and the other end thereof is exposed on another surface of the present ceramic substrate for the thin film electronic component. Namely, for example, when the ceramic substrate for the present thin film electronic component is provided with the mixed layer only on one face thereof, the other end of the wiring pattern may be exposed on a surface of the rear face side of the ceramic substrate base portion or on a side face of the ceramic substrate for the base portion. Further, when the present ceramic substrate for a thin film electronic component is provided with mixed layers on both sides thereof, the other end of the wiring pattern can be exposed on a surface of the mixed layer of the rear face side. Namely, the wiring pattern may be formed so as to pass through from a front to a rear of the ceramic substrate for a thin film electronic component or may be formed so as to electrically connect a surface side having a mixed layer with another side face of the ceramic substrate base portion. On other points than those described above, "wiring pattern" can be the same as used in the ceramic substrate for a thin film electronic component according to the aforementioned first aspect.

[2] Thin Film Electronic Component

The thin film electronic component according to the invention is characterized as comprising the ceramic substrate for a thin film electronic component according to the invention.

The aforementioned "ceramic substrate for a thin film electronic component" has the same meaning as the aforementioned ceramic substrate for a thin film electronic component according to the invention. The entire thickness of the ceramic substrate for a thin film electronic component is not particularly limited and is ordinarily from 200 to 2000 µm (preferably from 300 to 1000 µm).

As for thin film electronic components according to the invention, a thin film capacitor, an electronic component on which the thin film capacitor is mounted and the like can be used.

The electronic component can be prepared such that it comprises a capacitor portion in which conductor layers for the capacitor and a dielectric layer for the capacitor are laminated one on top the other on the ceramic substrate for a thin film electric component, in which the capacitor portion is formed by alternatingly laminating the conductor layer for the capacitor and the dielectric layer for the capacitor with each other. As such, the dielectric layer for the capacitor is interposed between two opposing conductor layers for the capacitor.

Namely, this is the thin film capacitor and an electronic component unit on which the thin film capacitor is mounted.

The aforementioned "capacitor portion" has a structure in which conductor layers for the capacitor and a dielectric layer for the capacitor are laminated one on top the other on the aforementioned mixed layer of the ceramic substrate for the thin film electronic component, in which the capacitor portion is formed by alternatingly laminating the conductor layer for the capacitor and the dielectric layer for the capacitor with each other. As such, the dielectric layer for the capacitor is interposed between two opposing conductor layers for the capacitor (see FIG. 7).

The aforementioned "conductor layer for the capacitor" is a conductor layer constituting the capacitor portion. The conductor layers for the capacitor are electrically conductive thin films opposing each other via the dielectric layer for the capacitor described below, and may comprise either one layer or two or more layers. Further, in a laminated portion between the conductor layer for the capacitor and the dielectric layer for the capacitor, ordinarily, the bottom and top layers each is a conductor layer for the capacitor. In this regard, any conductor layer for the capacitor is permissible, so long as it is electrically conductive (for example, a resistivity of 10 $\mu\Omega \cdot cm$ or less). The material of the conductor layer is not particularly limited, and useful materials include platinum, gold, copper, silver, nickel, titanium, molybdenum, chromium, cobalt, tungsten and the like.

These materials may be used either alone or in combination of two types or more. Further, the shape and a size of the conductor layer for the capacitor are not particularly limited. Still further, the thickness thereof is not particularly limited and is ordinarily 1 µm or less. These conductor layer materials, thickness of the conductor layer for the capacitor and the like are preferably appropriately selected in accordance with a desired resistance, productivity and the like and, further, in accordance with production cost.

The aforementioned "dielectric layer for the capacitor" constitutes the capacitor portion and a portion for insulating between electrically conductive layers for the capacitor. In this regard, any dielectric layer for the capacitor is permissible, so long as it is a dielectric (for example, having a resistivity of $10^{10}$ Ω·m or more). The material thereof is not particularly limited and useful examples thereof include titanates (such as barium titanate, strontium titanate and lead titanate), tantalum oxide and titanium oxide. These materials may be used either alone or in combination of two types or more thereof. Further, when two types or more thereof are used, they may be a mixture or a solid solution. Further, the shape and size of the dielectric layer for the capacitor are not particularly limited. Still further, the thickness thereof is not particularly limited and ordinarily is 1 µm or less. These dielectric layer materials, thickness of the dielectric layer for the capacitor and the like are preferably appropriately selected in accordance with electric characteristics such as the desired capacitance, insulating property breakdown voltage, productivity and the like, and further production cost.

When the aforementioned thin film electronic component according to the invention is produced, a method for forming the conductor layer for the capacitor is not particularly limited. The conductor layer for the capacitor can be formed using a thin film forming technique such as a sputtering method, a CVD method or a CSD method (chemical solution deposition method). Further, the thus-formed conductor layer can optionally be subjected to patterning, for example, by etching, to thereby form a conductor layer for the capacitor. At the time of etching and the like, a known photolithographic method or the like can be used.

Further, the method for forming the dielectric layer for the capacitor is not particularly limited and, for example, the CSD method can be used. Namely, the method is such that a dielectric raw material containing a metallic element which is to constitute the dielectric layer for the capacitor is applied on a face on which the layer is to be formed, and then subjected to a heat treatment to obtain the dielectric layer. The dielectric raw material to be used in the CSD method is not particularly limited and preferably contains an organic metallic compound containing a metallic element which constitutes the dielectric layer for the capacitor that is to be produced. An alkoxide, an acetic acid compound, an oxalic acid compound and the like can be used as the organic metallic compound. The alkoxides include, for example, titanium alkoxides such as titanium isopropoxide, barium alkoxides obtained by dissolving barium metal in an alcoholic organic solvent, and strontium alkoxides such as strontium-n-butoxide. A predetermined amount of pure water may be added to the alkoxide to polymerize the same and which is then used. The alcoholic organic solvents include a mixed solvent of ethanol and acetylacetone, 2-ethoxy ethanol and an alcoholic organic solvent containing a chemical species which can form a chelate with a target metallic species.

Further, the aforementioned dielectric raw material can be applied after being made uniform by heating and the like. Still further, a method of applying the dielectric raw material is not particularly limited and, for example, spin coat, dip coat and spray coat (including an inkjet method, a thermal method and the like) can be used. The resultant dielectric layer may optionally be subjected to patterning by, for example, etching, to thereby form a dielectric layer for the capacitor.

[3] Production Method for Ceramic Substrate for Thin Film Electronic Component

The ceramic substrate for a thin film electronic component having a wiring pattern among the ceramic substrates for the thin film electronic component according to the aforementioned present first aspect and second aspect and the method for obtaining the ceramic substrate for a thin film electronic component according to the present third aspect are not particularly limited and can be obtained by production methods according to the invention.

Namely, in the ceramic substrate for the present thin film electronic component, since the ceramic substrate for the base portion is a ceramic substrate, in a case in which an unsintered body is obtained, the unsintered body is formed by laminating, and then pattering, wiring formation and the like are performed on each layer thereof, and thereafter the resultant unsintered body is subjected to sintering, to thereby obtain a substrate having an interior wiring pattern. This feature has a large advantage as compared with a glass substrate and a monocrystal substrate. However, the aforementioned mixed layer is difficult to pattern in an unsintered state as compared to other ceramic layers. For this reason, the thin film electronic component is' produced by using a characteristic method of the invention.

Namely, a method for producing the thin film electronic component according to the first aspect of the invention is characterized as comprising the steps of: forming a glass layer; performing a heat-pressure treatment; and polishing for flattening treatment in the stated order.

The aforementioned "step of forming a glass layer" denotes a step of forming the glass layer on a surface of a ceramic substrate base portion comprising an interior wiring pattern in which an end face is exposed on the surface.

The aforementioned "step of performing heat-pressure treatment" denotes a step of performing the heat-pressure treatment on the glass layer, to thereby form a mixed layer containing glass in a surface portion of the ceramic substrate base portion.

The aforementioned "step of polishing for flattening" denotes a step of exposing the mixed layer and the interior wiring pattern while performing polishing for flattening.

These steps can encompass the respective methods in the ceramic substrate for a thin film electronic component according to the aforementioned second aspect.

EXAMPLES

Hereinafter, the invention is described in yet further detail by reference to the drawings. However, the present invention should not be construed as being limited thereto.

[1] Preparation of Ceramic Substrate for Thin Film Electronic Component (Having no Interior Wiring Pattern)

(1) Preparation of Ceramic Substrate for Base Portion

Alumina powder ($Al_2O_3$ purity: 90% or more) having an average particle diameter of 3 to 5 µm and flux powder (sintering aid) comprising, as main components, $Al_2O_3$, $SiO_2$ and CaO were prepared. When the entire mixed powder was taken as 100% by mass, the alumina powder and the flux powder were mixed with each other such that they became 90 to 95% by mass and 5 to 10% by mass, respectively, to thereby obtain the mixed powder. A slurry obtained using the thus-obtained mixed powder was prepared in sheet form having a thickness of 200 μm using a doctor blade method and cut in a desired size, to thereby obtain an unsintered sheet. Three unsintered sheets thus obtained were laminated with one another, to thereby obtain an unsintered ceramic sheet base portion having a thickness of 600 μm. The thus-obtained unsintered ceramic sheet base portion was sintered, to thereby obtain a ceramic substrate base portion. The surface roughness of the thus-obtained ceramic substrate base portion was measured using a stylus-type surface roughness tester (trade name: SURFCOM 1400D; available from Tokyo Seimitsu Co., Ltd.). As measured, Ra was 0.24 μm and Ry was 5.7 μm.

Then, a surface of the thus-obtained ceramic substrate base portion was polished to be flat and exposed, to thereby level the surface. The surface roughness of the thus-polished ceramic substrate base portion was measured in the same manner as described above. As measured, Ra was 0.078 μm and Ry was 0.97 μm.

(2) Formation of Mixed Layer

Figure 3:
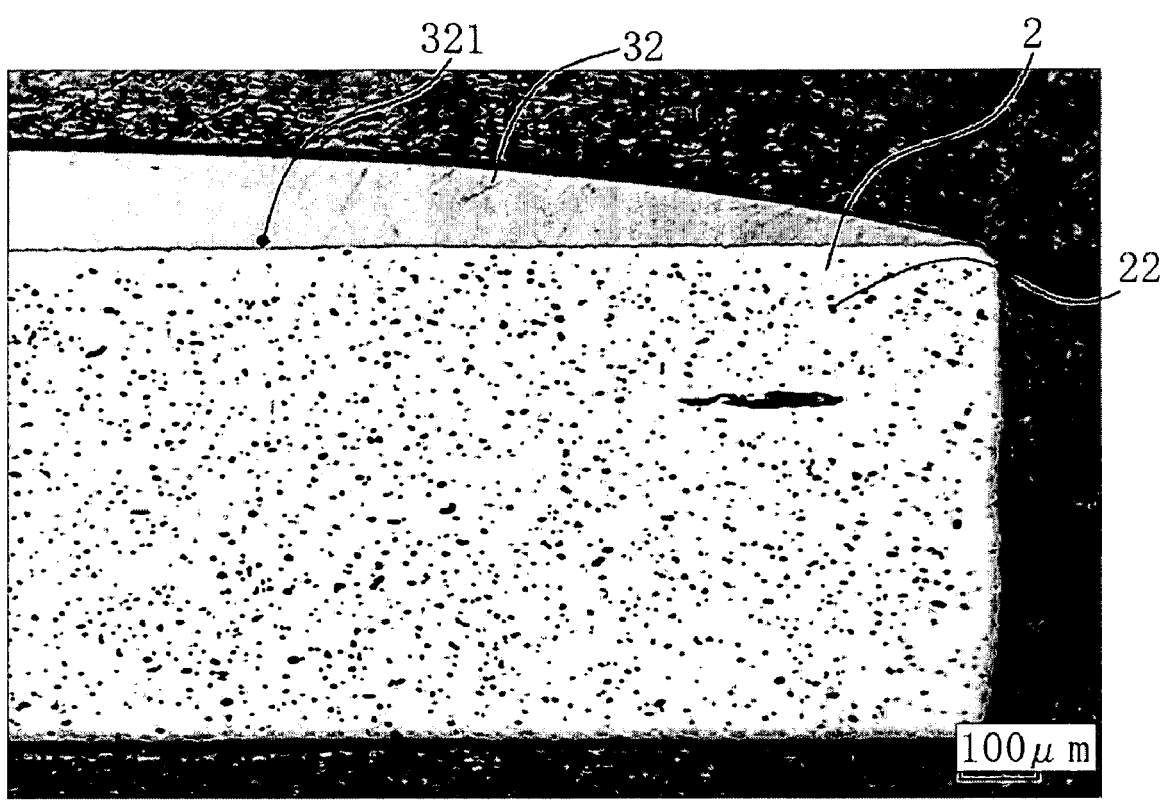
FIG. 3 is an image of 200 magnifications of a cross-section of a glass layer and a ceramic substrate base portion which are not subjected to a heat-pressure treatment in the present embodiment.

An acrylic resin (binder) was dissolved in terpineol (solvent) and, then, the resultant solution was mixed with glass powder, to thereby obtain a glass paste. In this regard, when the entire glass powder comprising Si, B, Al and Ca is taken as 100% by mol in terms of $SiO_2$, $B_2O_3$, $Al_2O_3$ and CaO, respectively, a glass powder having an average particle diameter of 3 μm comprising 55 to 65% by mol of Si, 15 to 25% by mol of B, 5 to 15% by mol of Al and 5 to 15% by mol of Ca was used. The glass paste was applied to the ceramic substrate base portion by screen printing, dried and fired at 1000° C. in an atmospheric environment. The ceramic substrate base portion having the thus-fired glass layer on a surface thereof was cut to examine its cross-section. An image of 200 magnifications of a portion of the cross-section thereof was obtained and is shown in FIG. 3.

Figure 4:
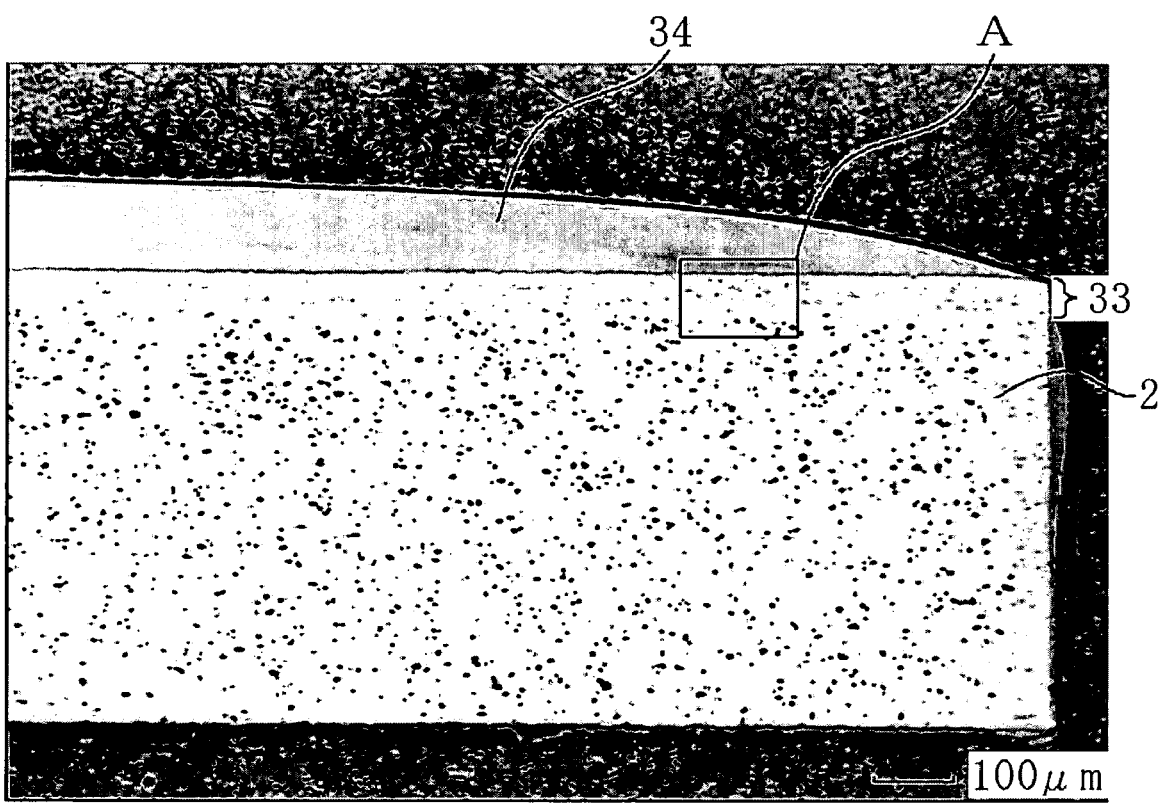
FIG. 4 is an image of 200 magnification of a cross-section of a glaze layer, a dense glass-ceramic mixed layer and a ceramic substrate base portion which are subjected to a heat-pressure treatment in the present embodiment.
Figure 5:
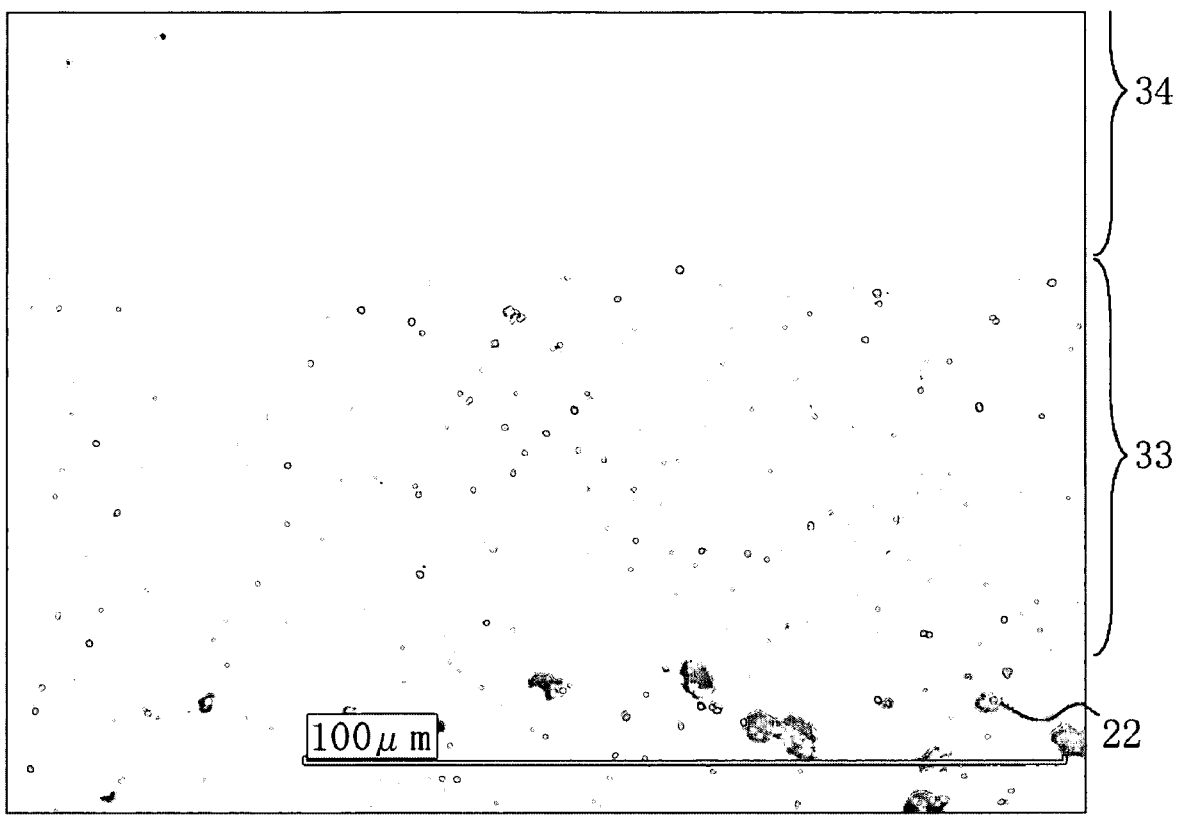
FIG. 5 is an image of 2000 magnifications of an area "A" in FIG. 4.

Thereafter, the ceramic substrate for the base portion having the glass layer formed thereon (uncut article of a same lot) was placed in an HIP furnace, and then the temperature in the furnace was elevated to 800° C. without applying pressure, to thereby sufficiently soften the glass layer. Subsequently, the temperature in the furnace was elevated from 800° C. to 950° C. in a nitrogen atmosphere while applying a pressure of 5 MPa, and then the substrate was subjected to a heat-pressure treatment for 15 minutes. Thereafter, the ceramic substrate base portion having a mixed layer and a glaze layer formed thereon was removed from the HIP furnace. The ceramic substrate base portion, which had been subjected to the heat-pressure treatment, having a glaze layer on a surface thereof and a mixed layer in a surface portion thereof was cut to examine its cross-section. An image of 200 magnifications of a portion (nearly same area as in FIG. 3) of the cross-section was obtained and is shown in FIG. 4. Further, an image of 2000 magnifications of an area marked "A" of a portion of FIG. 4 was obtained and is shown in FIG. 5.

Figure 6:
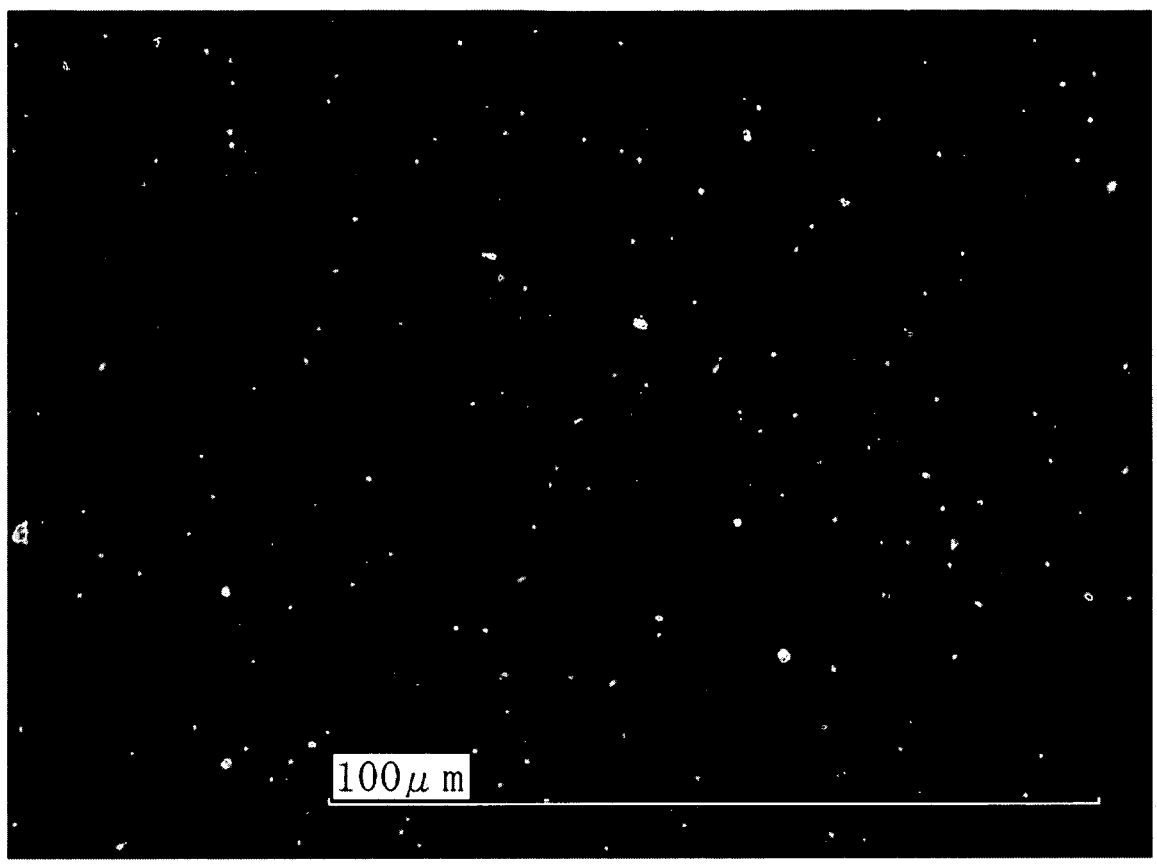
FIG. 6 is an image of 2000 magnifications of a surface of an example of a ceramic substrate for a thin film electronic component according to the invention.

Next, polishing for flattening was performed to remove the glaze layer formed by the heat-pressure treatment, to thereby expose the mixed layer on a surface. The polishing for flattening was performed by means of mechanical polishing using a diamond paste. Different types of diamond pastes were used in which the grain diameter of a diamond grinding grain in the respective pastes was gradually reduced in accordance with the order of usage. The diamond paste used last had an average grain diameter of 2 μm or less. The surface roughness of the thus-obtained mixed layer after having been subjected to polishing for flattening was measured using a stylus-type surface roughness tester. As measured, Ra was 0.009 μm and Ry was 0.11 μm. Further, an image of 200 magnifications of the surface of the mixed layer subjected to polishing for flattening is shown in FIG. 6.

(3) Evaluation

From these results, with regard to the surface of the ceramic substrate base portion, Ra was as large as 0.24 μm and Ry was as large as 5.7 μm. Further, even when the surface thereof was polished, as to surface roughness, flatness was improved but only to such an extent that Ra became 0.078 μm and Ry became 0.97 μm. From FIG. 3, it was found that a multiplicity of pores (22) each having a black grain appearance were present inside the ceramic substrate base portion (2) and, also, these pores were observed in the surface portion thereof. Namely, in the ceramic substrate base portion, the surface roughness is hardly decreased due to these pores.

On the other hand, from FIG. 4 which shows a state after heat-pressure treatment, voids (321), which were observed as each having a black grain appearance in the glass layer (32) in FIG. 3, disappeared and a dense glaze layer (34) was obtained. Further, pores (22) which were observed in the surface portion of the ceramic substrate for the base portion (2) right under the glaze layer (34) in FIG. 3 were not observed at all. Namely, it is found that a dense glass-ceramic mixed layer (33) was formed. The thickness of this mixed layer (33) was about 50 μm. Although artifacts each having a gray grain appearance were observed in an area marked by "A" of the mixed layer (33), it was found, from FIG. 5 which is a magnified view of the area "A" in FIG. 4, that these artifacts resulted from glass filling in the pores (22) of the ceramic substrate for the base portion (2). Namely, these artifacts each having a gray grain appearance were not pores. Further, also in FIG. 6, no pores were observed.

With regard to the surface of the mixed layer subjected to polishing for flattening, Ra was 0.009 μm and Ry was 0.11 μm. This means that Ra was reduced by 96% from that of the surface of the ceramic substrate base portion and Ry by 98% therefrom and, further, Ra was reduced by 88% from that of the surface of the ceramic substrate base portion which had been subjected to polishing for flattening and Ry by 89% therefrom.

Namely, according to the invention, it is found that, even when the aforementioned general-purpose ceramic substrate having a multiplicity of pores is used, the surface roughness can be reduced by at least 88%.

Figure 2:
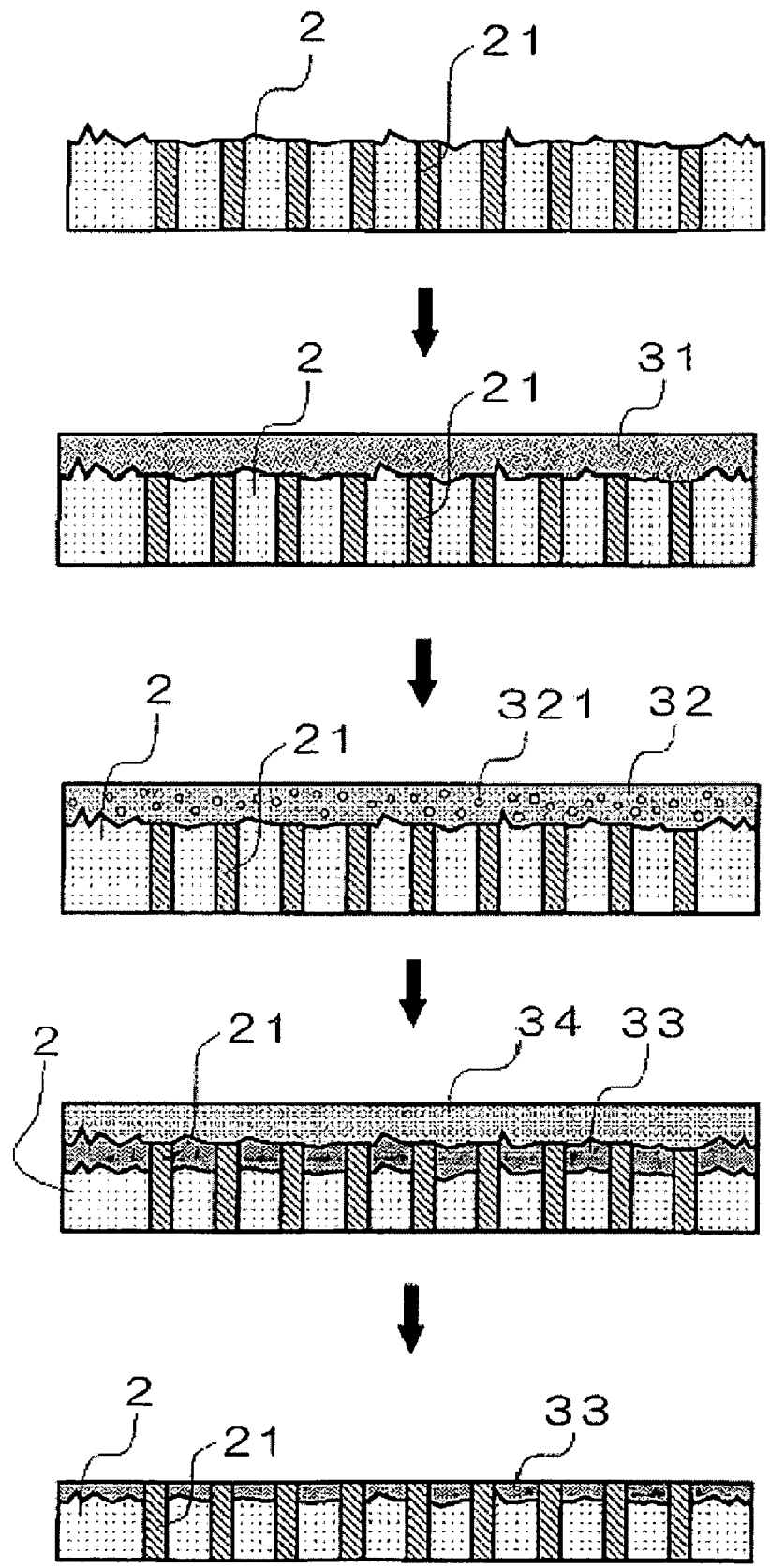
FIG. 2 is an explanatory diagram showing a production process of an example of a ceramic substrate for a thin film electronic component according to the invention.

[2] Preparation 1 of Ceramic Substrate for Thin Film Electronic Component Having Wiring Pattern Hereinafter, preparation of a ceramic substrate for a thin film electronic component (1) having a wiring pattern (21) is described with reference to FIG. 2.

(1) Preparation of Ceramic Substrate for Base Portion (2)

In the same manner as in the aforementioned [1] (1), an unsintered ceramic sheet base portion having a thickness of 600 μm was obtained. A via hole having a diameter of 120 μm (100 μm after sintering) was formed on the thus-obtained unsintered ceramic sheet for the base portion using a $CO_2$ laser. Next, an electrically conductive hole-filling agent (becoming an interior wiring pattern after sintering) comprising, as main components, tungsten powder, ethyl cellulose (binder) and butyl carbitol (solvent) was prepared, and then filled in the previously-formed via hole by printing. Then, the unsintered body which had so far been obtained was cut in a desired size and sintered, to thereby obtain the ceramic substrate base portion (2) having a wiring pattern (21).

(2) Glass Layer Forming Process, Heat-pressure Process and Polishing Process for Flattening A glass paste obtained in the same manner as in the aforementioned [1] (2) was applied in a same manner and dried, to thereby form a glass paste layer (31) comprising the glass paste having a dry thickness of 250 µm. Thereafter, the thus-formed glass paste layer (31) was fired in a non-oxidative atmosphere comprising $N_2$—$H_2$-$H_2O$ at 1000° C. to become vitrified, thereby forming a glass layer (32) having a thickness of 100 µm. Next, the thus-formed glass layer (32) was subjected to HIP treatment in a same manner as in the aforementioned [1] (2), to thereby form a mixed layer (33). Thereafter, the thus-formed mixed layer (33) was subjected to polishing for flattening in a same manner as in the aforementioned [1] (2), to thereby obtain a ceramic substrate for a thin film electronic component (1) having a wiring pattern (21) and provided with the mixed layer (33), as shown in FIG. 1, in which a surface roughness Ra was 0.01 µm or less and Ry was 0.2 µm or less.

[3] Preparation of Thin Film Electronic Component (Preparation of Thin Film Capacitor)

Figure 7:
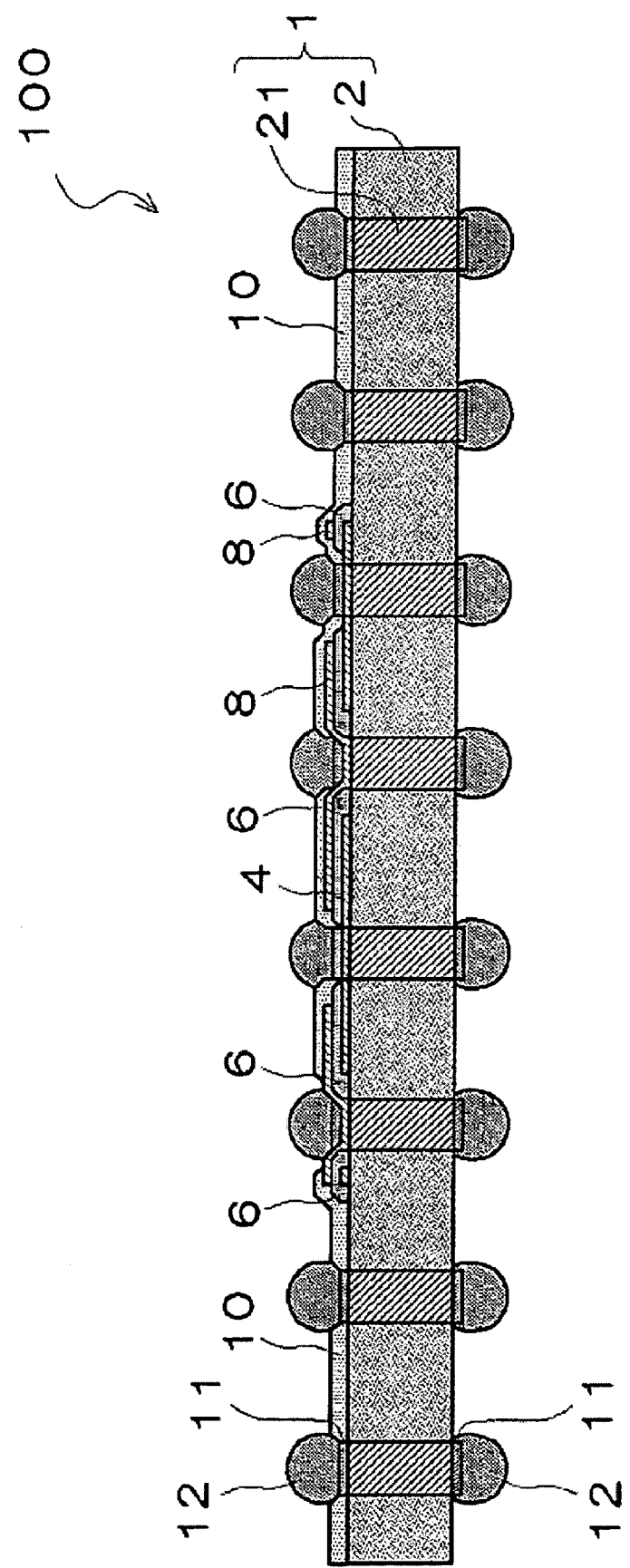
FIG. 7 is a cross-sectional diagram schematically showing a cross-section of a thin film electronic component (thin film capacitor) according to the invention.
Figure 8:
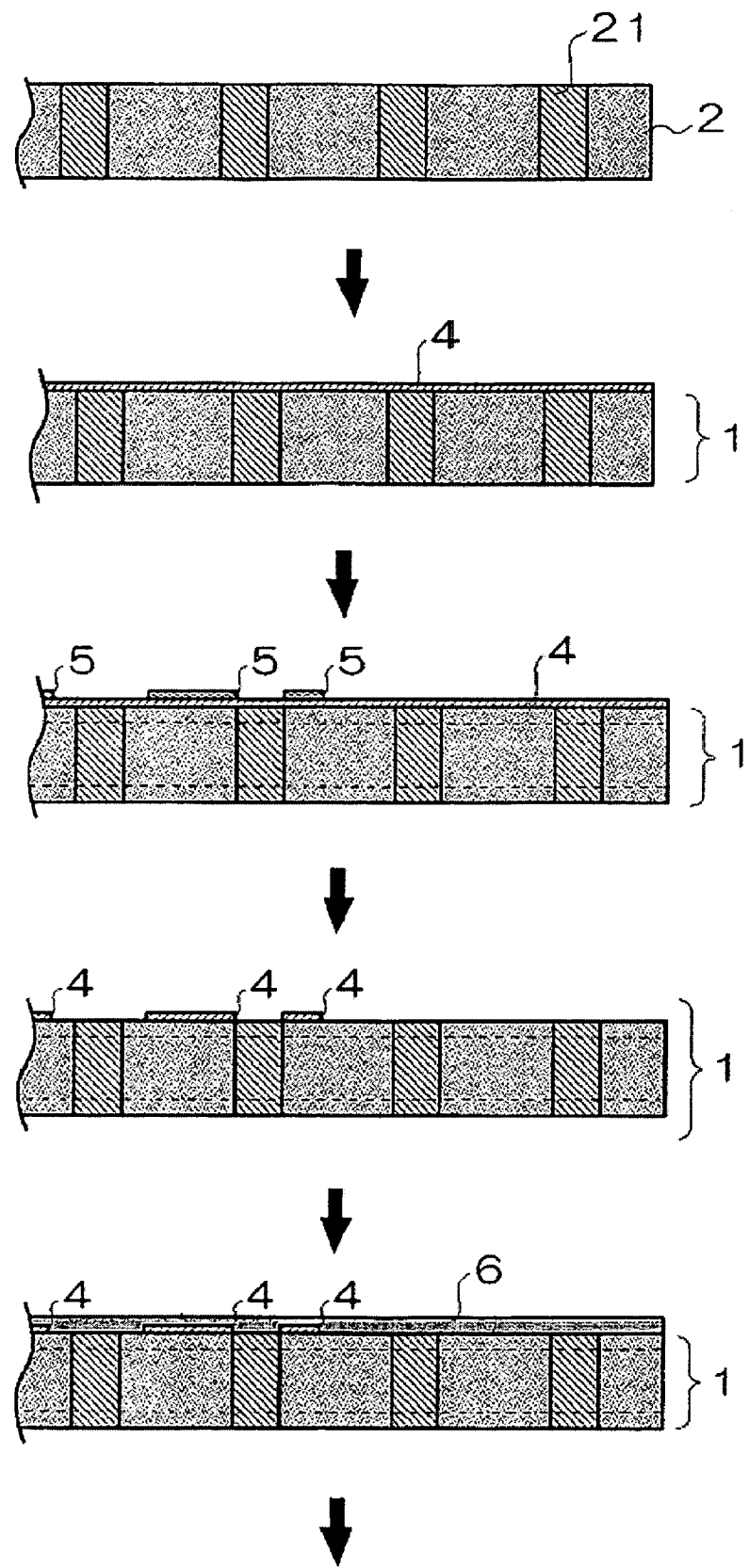
FIG. 8 is an explanatory diagram schematically showing a production process of a thin film capacitor according to the invention.
Figure 9:
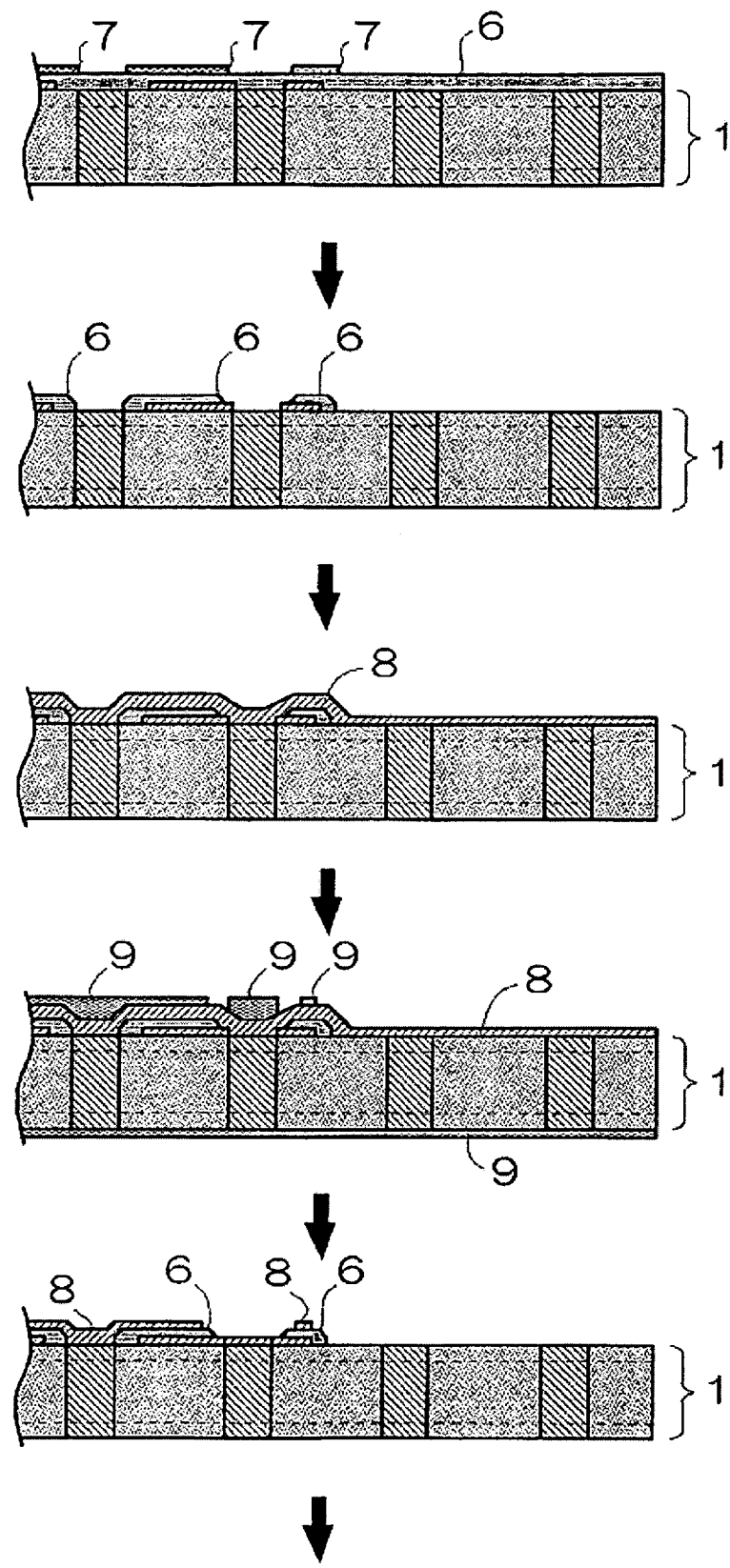
FIG. 9 is an explanatory diagram schematically showing a production process of a thin film capacitor according to the invention.
Figure 10:
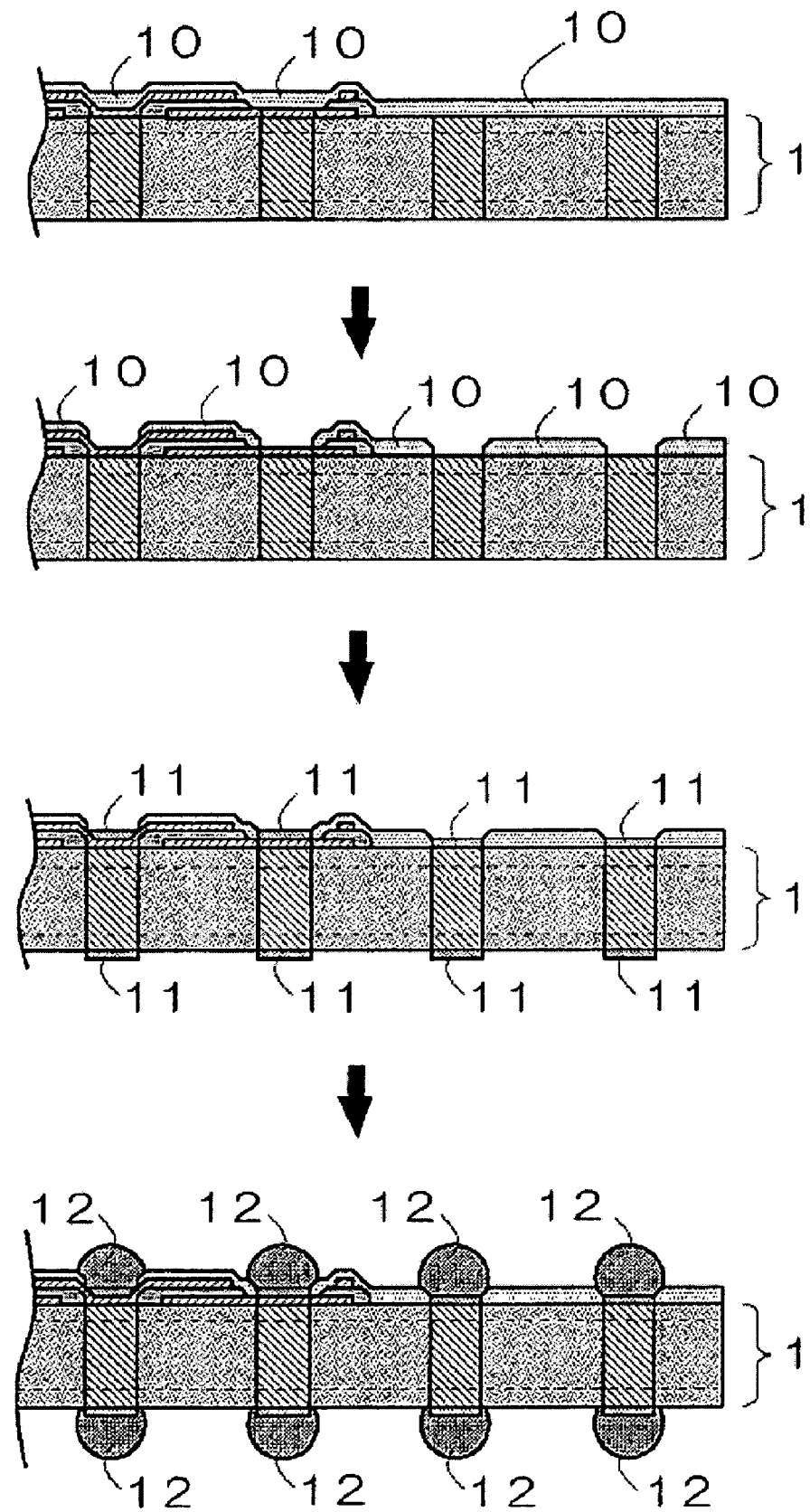
FIG. 10 is an explanatory diagram schematically showing a production process of a thin film capacitor according to the invention.

Hereinafter, preparation of a thin film capacitor (100) is described with reference to FIGS. 7 to 10. Further, FIGS. 8 to 10 explain a half part in a right-hand side of the thin film capacitor (100) as shown in FIG. 7. Still further, the same reference numerals identifying structural elements before and after sintering are used for convenience sake. (1-a) to (1-d) described below are in reference to FIG. 8; (1-e) to (1-i) described below are in reference to FIG. 9; and (1-j) to (1-m) described below are in reference to FIG. 10.

(1-a): On one face side of the ceramic substrate for the thin film electronic component (1) obtained in the aforementioned [2], a conductor layer for a capacitor (4) comprising platinum having a thickness of 0.2 µm was formed by sputtering. This conductor layer for the capacitor (4) mainly forms a bottom electrode inside the capacitor.

(1-b): Next, in order to pattern the conductor layer for the capacitor (4), an etching resist (5) is formed on a portion which does not require etching of the conductor layer for the capacitor (4).

(1-c): Thereafter, etching is performed using ion milling, to thereby pattern the conductor layer for the capacitor (4). Subsequently, the etching resist (5) was removed.

(1-d): Next, a dielectric raw material (6) prepared by dissolving titanium isopropoxide, strontium-n-butoxide and metallic barium in 2-ethoxy ethanol was applied by spin coating on a surface of a substrate having the conductor layer for the capacitor (4) on which the patterning was performed. Thereafter, the thus-applied dielectric raw material (6) was dried and thermally treated at 700° C., to thereby obtain a dielectric layer for the capacitor (6) having a thickness of 0.2 µm.

(1-e): In order to pattern the thus-obtained dielectric layer for the capacitor (6), an etching resist (7) was formed on those portions which are not to be etched.

(1-f): Thereafter, etching was performed on the dielectric layer for the capacitor (6) using buffered hydrofluoric acid, to thereby pattern the dielectric layer for the capacitor (6). Subsequently, the etching resist (7) was removed.

(1-g): Next, on a surface of the dielectric layer for the capacitor (6) which was patterned, a conductor layer for a capacitor (8) comprising platinum having a thickness of 0.2 µm was formed by sputtering. This conductor layer for the capacitor (8) mainly forms a top electrode inside the capacitor.

(1-h): Thereafter, in order to pattern the conductor layer for the capacitor (8), an etching resist (9) was formed on those portions (a rear face side of the ceramic substrate for the thin film electronic component on a side in which the capacitor portion is not formed was also protected by the etching resist) which are not to be etched.

(1-i): Thereafter, etching was performed using ion milling, to thereby pattern the conductor layer for the capacitor (8). Subsequently, the etching resist (9) was removed.

(1-j): Thereafter, a solder resist layer (10) was formed.

(1-k): Next, solder resist (10) was patterned (a surface of a via conductor was exposed by this patterning).

(1-l): Thereafter, on a surface of the via conductor (21) which was exposed as in the aforementioned (1-k), a nickel-gold plated layer (11) was formed by electroless plating.

(1-m): Next, on a surface of the nickel-gold plated layer (11) formed in the aforementioned (1-l), a solder ball (12) was formed, to thereby obtain a thin film capacitor (100).

[4] Preparation 2 of Thin Film Electronic Component (Preparation 2 of Thin Film Capacitor)

Figure 11:
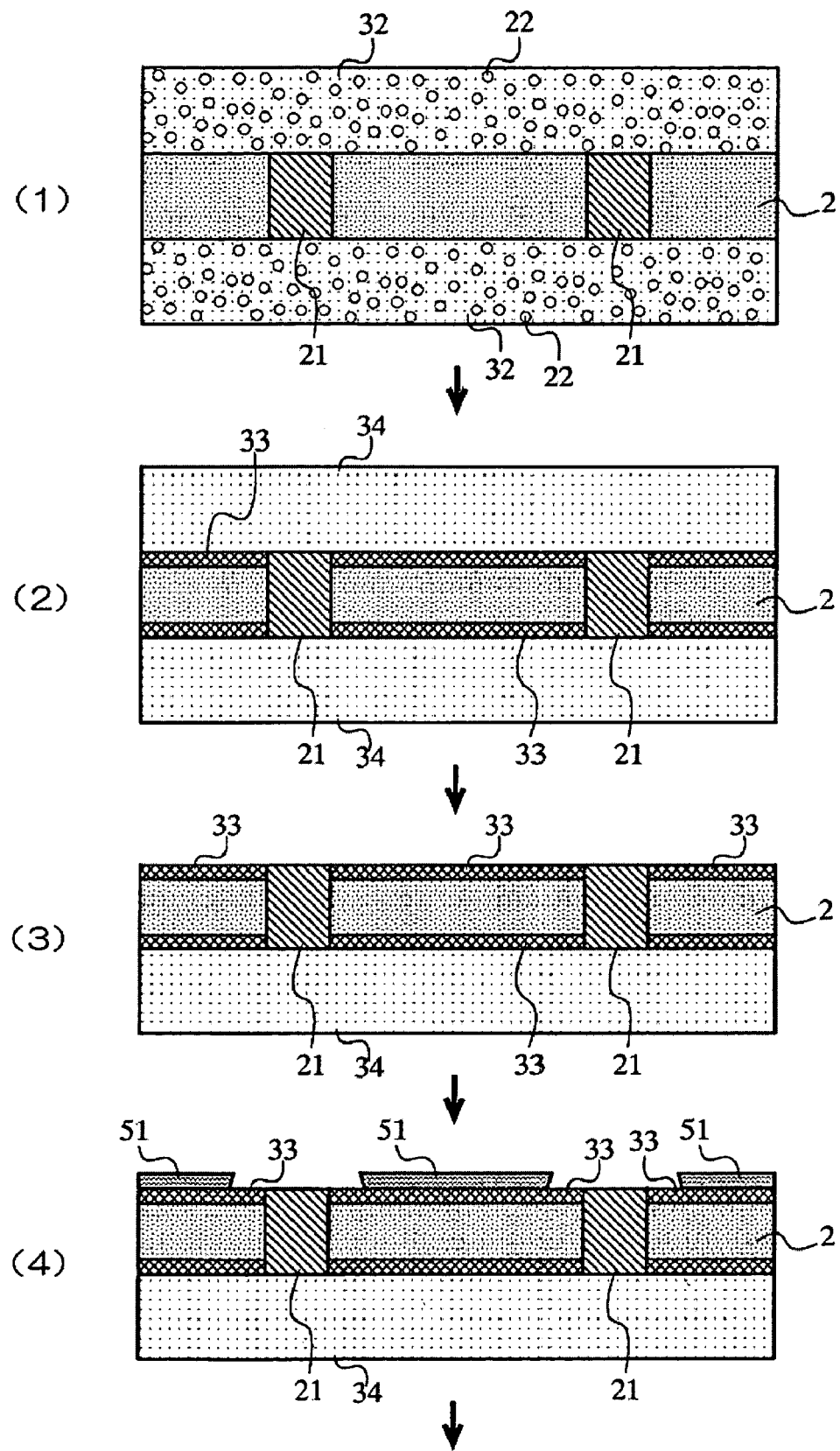
FIG. 11 is an explanatory diagram schematically showing another production process of a thin film capacitor according to the invention.
Figure 12:
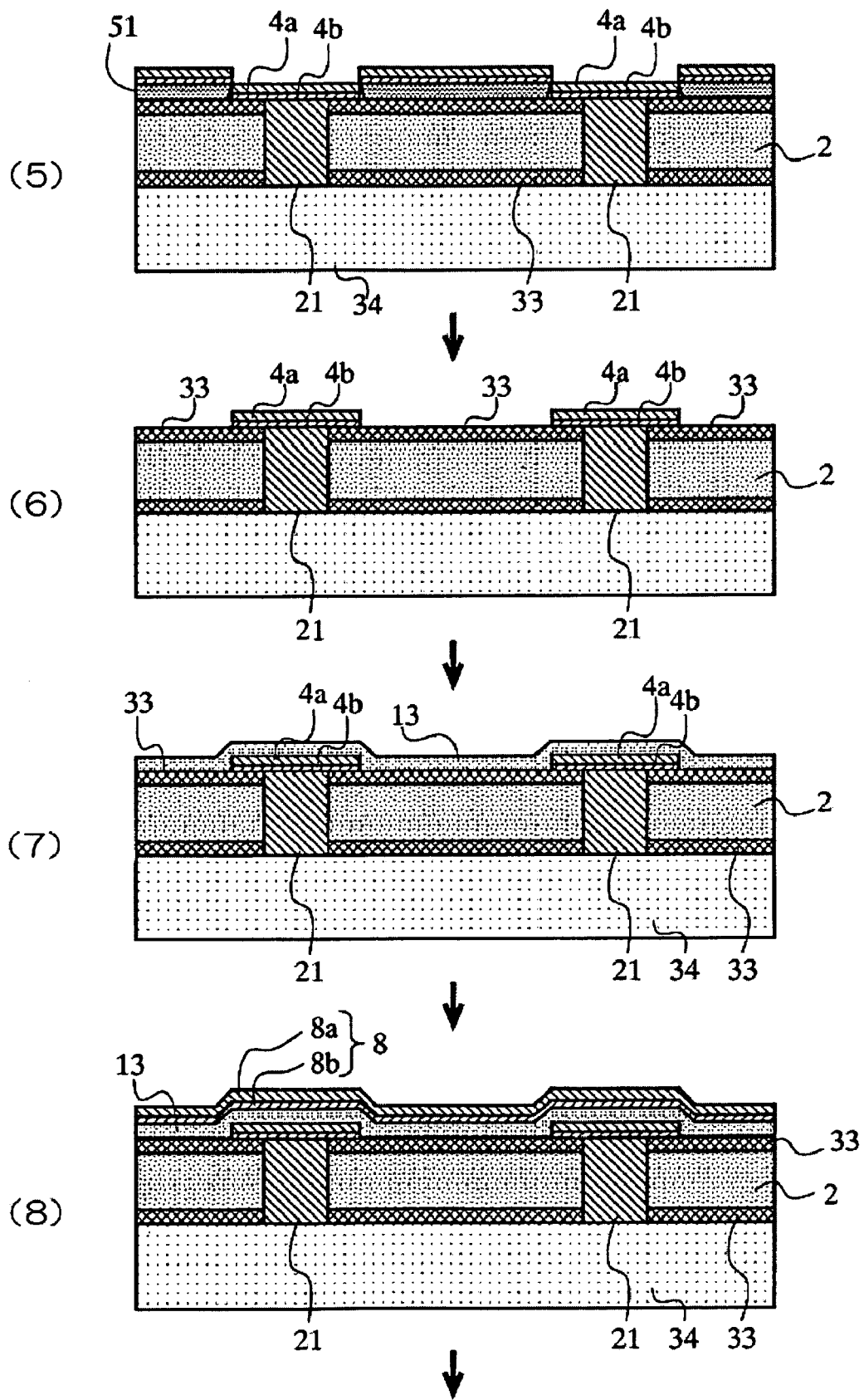
FIG. 12 is an explanatory diagram schematically showing another production process of a thin film capacitor according to the invention.
Figure 13:
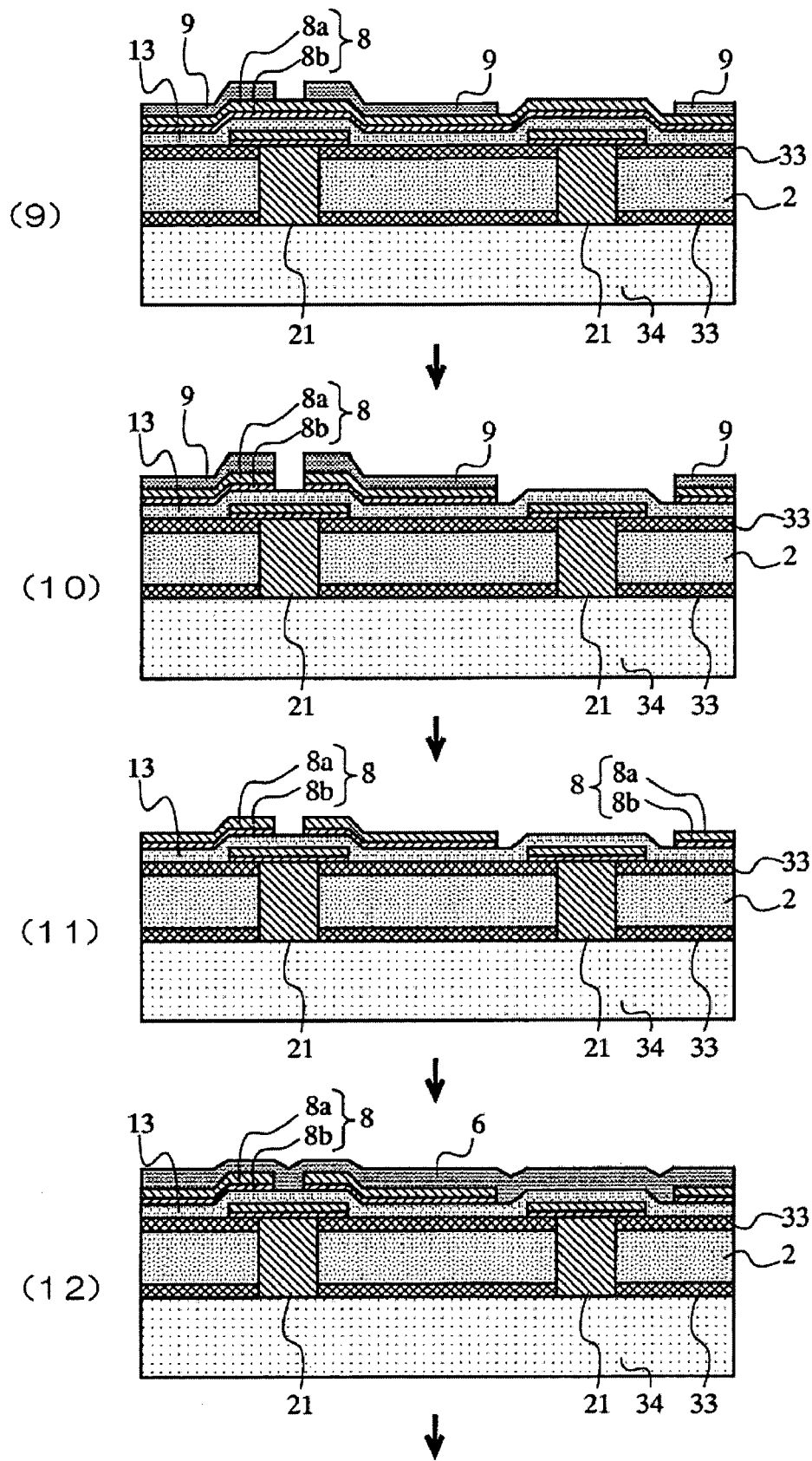
FIG. 13 is an explanatory diagram schematically showing another production process of a thin film capacitor according to the invention.
Figure 14:
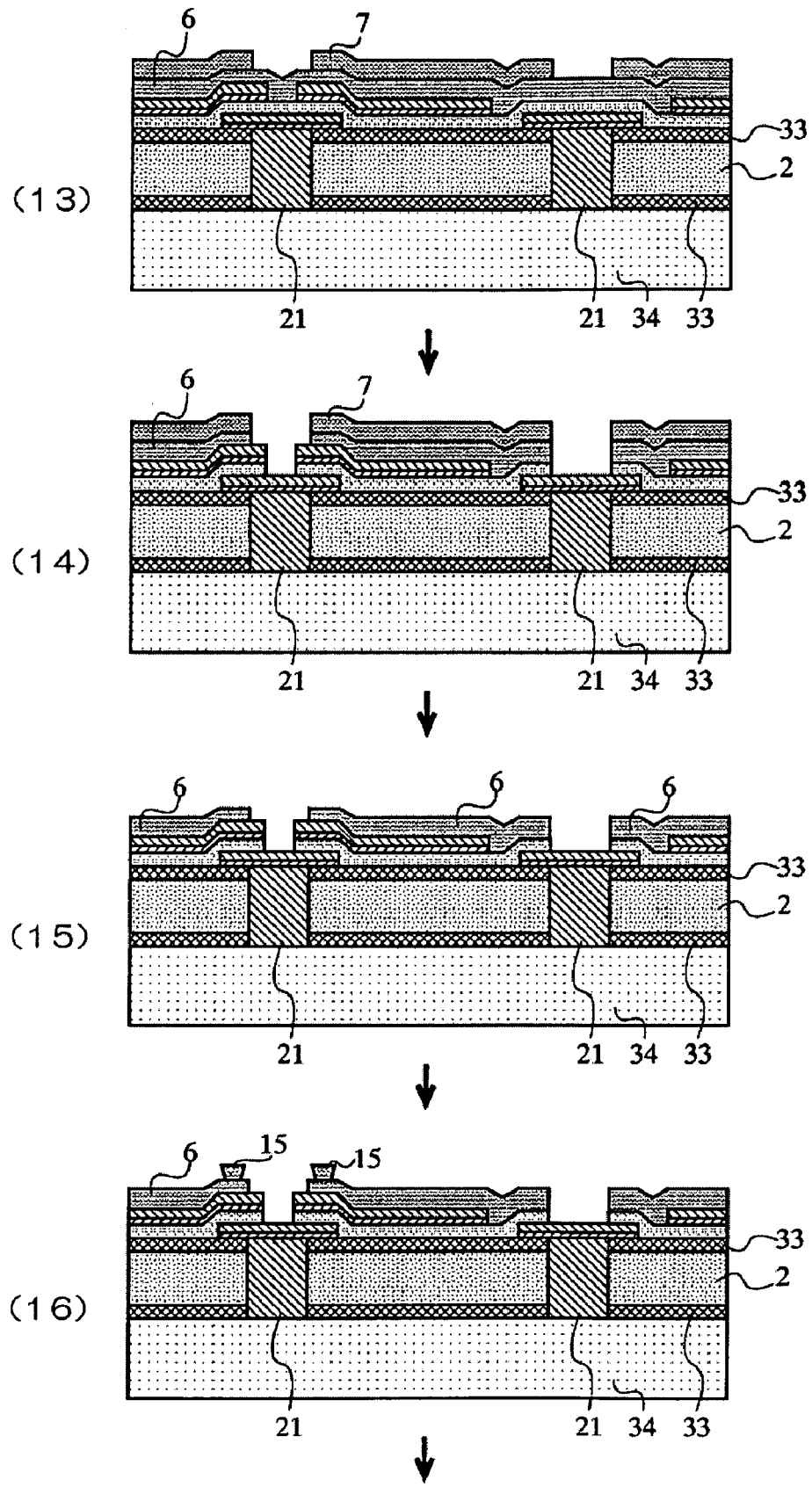
FIG. 14 is an explanatory diagram schematically showing another production process of a thin film capacitor according to the invention.
Figure 15:
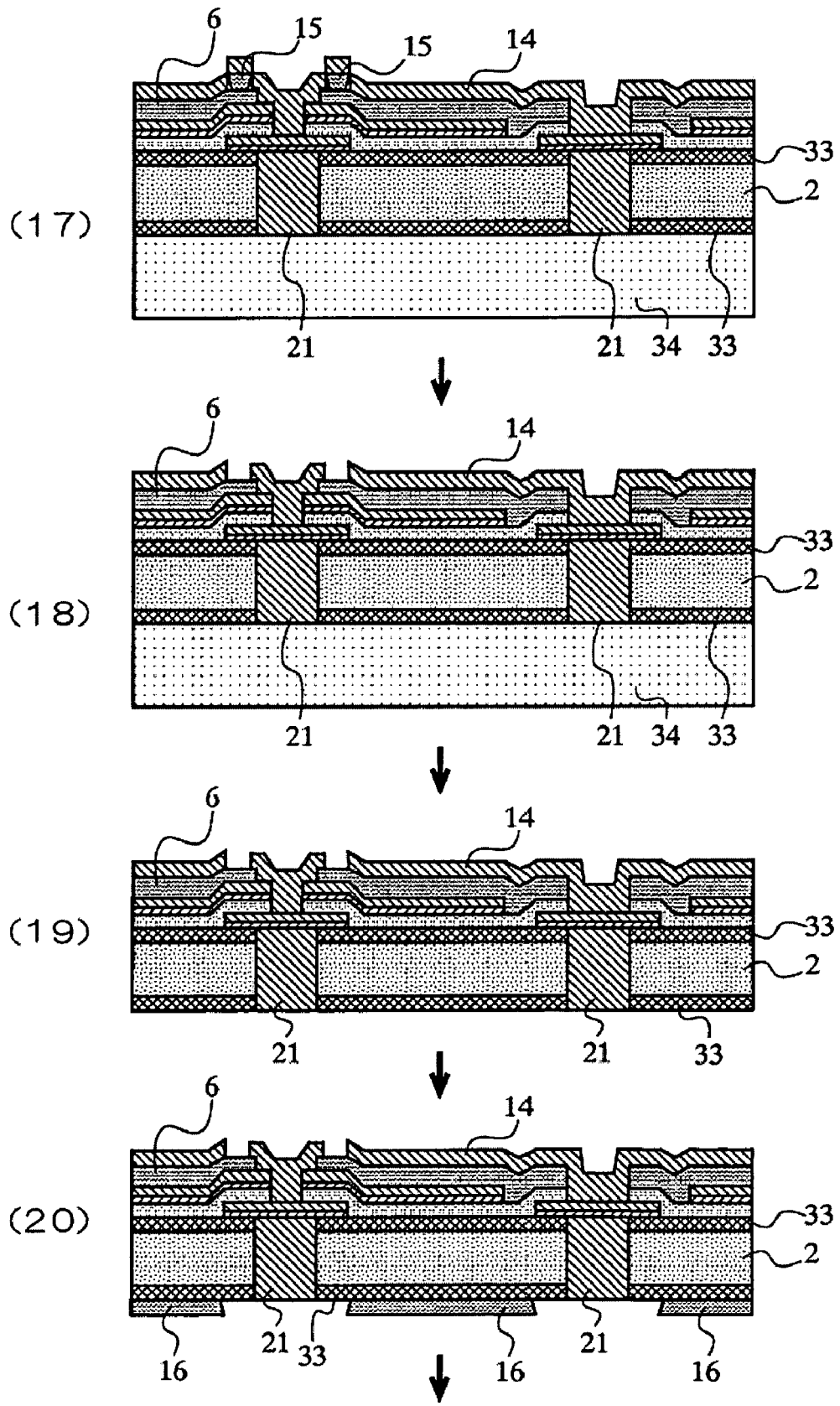
FIG. 15 is an explanatory diagram schematically showing another production process of a thin film capacitor according to the invention.
Figure 16:
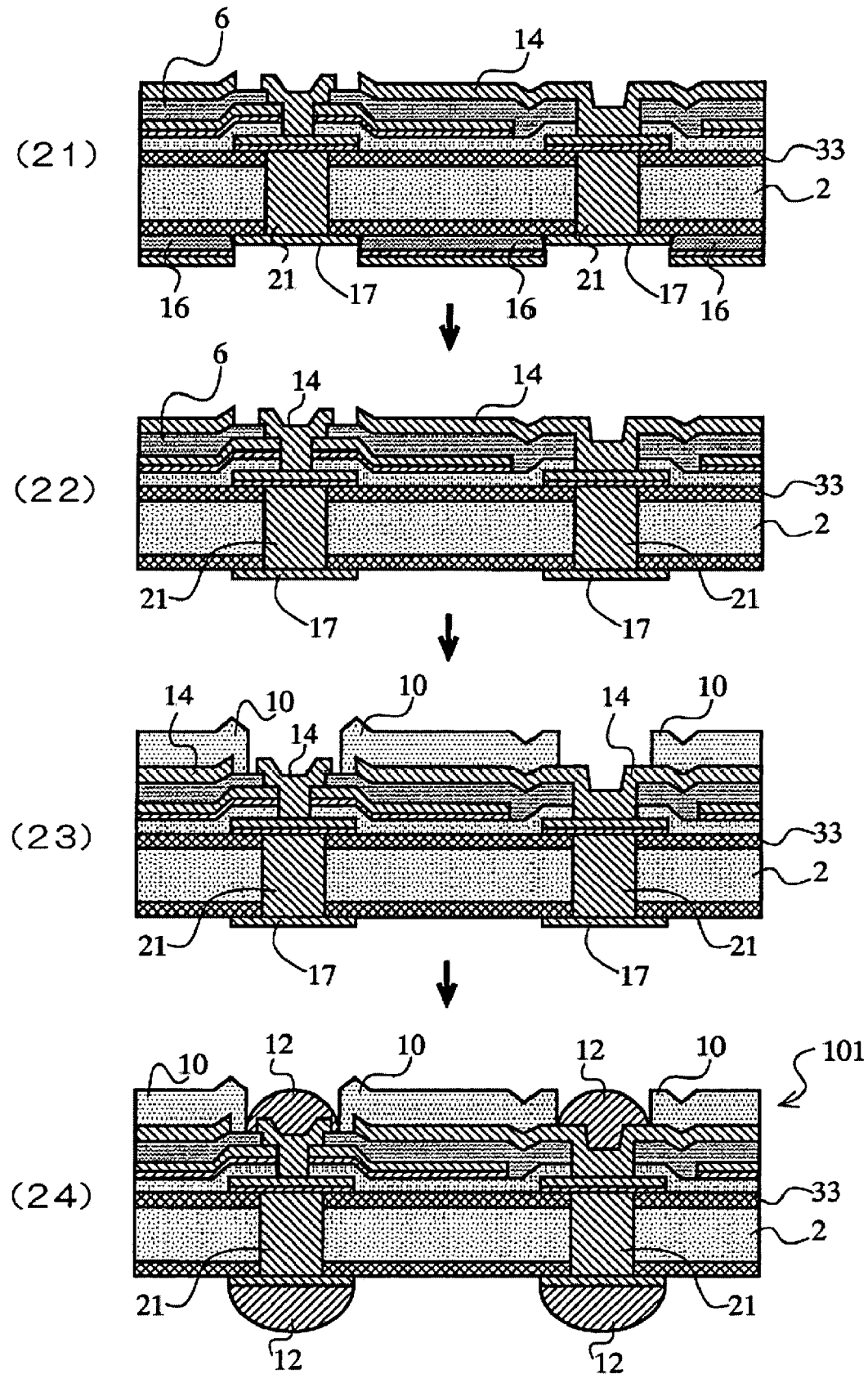
FIG. 16 is an explanatory diagram schematically showing another production process of a thin film capacitor according to the invention.

Hereinafter, preparation of a thin film electronic component (101) (preparation of thin film capacitor) different from that described in the aforementioned [3] is described with reference to FIGS. 11 to 16, in which FIG. 11 is continued to FIG. 12; FIG. 12 continues to FIG. 13; FIG. 13 continues to FIG. 14; FIG. 14 continues to FIG. 15; and FIG. 15 continues to FIG. 16.

(1) Glass Layer Forming Process

On both faces of a front and rear of the ceramic substrate base portion (2) obtained in the same manner as in the aforementioned [2] (1), the glass paste obtained in the same manner as in aforementioned [1] (2) was applied in the same manner as above and dried, to thereby form a glass paste layer (31) having a dry thickness of 250 µm on each front and rear face side. Thereafter, the glass paste layer (31) was fired in a non-oxidative atmosphere of $N_2$—$H_2$—$H_2O$ at 1000° C. to become vitrified, thereby forming a glass layer (32) having a thickness of 100 µm.

(2) Heat-pressure Process

An HIP treatment was performed thereon in a same manner as in the aforementioned [1] (2), to thereby, form a mixed layer (33).

(3) Polishing Process for Flattening

Thereafter, polishing for flattening was performed only on a surface side in the same manner as in the aforementioned [1] (2), to thereby obtain a ceramic substrate for a thin film electronic component (1) having a wiring pattern (21) according to the invention and provided with a mixed layer (33) having a surface roughness Ra of 0.01 µm or less and Ry of 0.2 µm or less.

(4) Forming Process for Resist Layer for Patterning of Conductor Layer for Capacitor On a surface of the ceramic substrate for the thin film electronic component (1) which had been obtained up through the aforementioned (3), a photosensitive resist was applied by spin coating and, thereafter, patterned to thereby form a photoresist layer (51) for patterning the conductor layer for the capacitor.

(5) Forming Process for Conductor Layer for Capacitor

On a surface side of the ceramic substrate for the thin film electronic component (1) obtained in the aforementioned (4), a conductor bottom layer for a capacitor (4b) having a thickness Φ of 0.02 µm comprising tantalum was formed by sputtering. Thereafter, a conductor top layer for a capacitor (4*a*) comprising platinum having a thickness of 0.2 μm was formed by sputtering. Namely, the conductor layer for the capacitor (4) comprises the conductor bottom layer for the capacitor (4*b*) and the conductor top layer for the capacitor (4*a*).

(6) Photoresist Layer Removing Process

After the aforementioned (5) was performed, the photoresist layer (51) which was no longer needed was completely removed with a resist removal liquid.

(7) SiO$_2$ Layer Forming Process

On the conductor layer for the capacitor on which patterning was performed in the aforementioned (6), an SiO$_2$ layer (13) was formed by a plasma CVD method in a stratified state.

(8) Forming Process for Conductor Layer for Capacitor

A conductor layer for a capacitor (8) comprising a conductor bottom layer for a capacitor (8*b*) comprising tantalum and a conductor top layer for a capacitor (8*a*) comprising platinum was formed in the same manner as in the aforementioned (5).

(9) Forming Process for Resist Layer for Patterning of Conductor Layer for Capacitor In order to pattern the conductor layer for the capacitor (8) formed in the aforementioned (8), an etching resist (9) was formed on those portions which are not to be etched.

(10) Patterning Process for Conductor Layer for Capacitor

The conductor layer for capacitor (8) formed in the aforementioned (9) was etched using ion milling, to thereby pattern the conductor layer for the capacitor (8).

(11) Removing Process for Resist Layer for Pattering of Conductor Layer for Capacitor The etching resist (9) which was used in the aforementioned (10) was removed.

(12) Forming of Dielectric Layer for Capacitor

A dielectric raw material (6) prepared by dissolving titanium isopropoxide, strontium-n-butoxide and metallic barium in 2-ethoxy ethanol was applied by spin coating on a surface of a substrate having the conductor layer for the capacitor (8) on which the patterning was performed. Thereafter, the thus-applied dielectric raw material (6) was dried and thermally treated at 700° C., to thereby obtain a dielectric layer for the capacitor (6) having a thickness of 0.2 μm.

(13) Forming Process for Resist Layer for Patterning of SiO$_2$ Layer and Dielectric Layer for Capacitor In order to pattern the SiO$_2$ layer (13) obtained in the aforementioned (7) and the dielectric layer for the capacitor (6) obtained in the aforementioned (12), an etching resist (7) was formed on those portions which are not to be etched.

(14) Patterning of SiO$_2$ and Dielectric Layer for Capacitor

The etching was performed on the SiO$_2$ layer (13) and the dielectric layer for the capacitor (6) using buffered hydrofluoric acid, to thereby pattern each layer. Further, this pattering process can also be performed by the ion milling method.

(15) Removing Process for Resist Layer for Patterning of SiO$_2$ Layer and Dielectric Layer for Capacitor After being subjected to the aforementioned (14), the etching resist (7) for the SiO$_2$ layer and the dielectric layer for the capacitor were removed.

(16) Forming Process for Resist Layer for Forming Dielectric Layer for Capacitor A resist layer (15) for protecting those portions which do not call for a conductor layer for capacitor (14) described below was formed on a surface side of the ceramic substrate for a thin film electronic component (1) which was subjected to the aforementioned (15).

(17) Forming Process for Conductor Layer for Capacitor

On a surface side of the ceramic substrate for a thin film electronic component (1) which was subjected to the aforementioned (16), a conductor top layer for a capacitor (14) comprising platinum was formed.

(18) Removing Process for Resist Layer for Forming Conductor Layer for Capacitor By removing the resist layer (15) which was used in the aforementioned (17), the conductor layer for the capacitor (14) was patterned.

(19) Removing Process for Glaze Layer on a Rear Face Side

After a thin film laminate portion on a surface side was protected by a protection tape (not shown), a glaze layer (34) on a rear face side which was formed in the aforementioned (2) was removed by polishing performed in the same manner as in the aforementioned (3), to thereby expose a surface of the dense glass-ceramic mixed layer (33) and, also, to expose the wiring pattern (21) from a surface on a rear face side.

(20) Forming of Resist Layer for Solder Ball Connection Pattern

A resist layer (16) for forming a solder ball connection pattern (17) for improving a connection property of a solder ball (12) on a rear face side described below was formed on a rear face side of the ceramic substrate (1) as attained in the aforementioned (19).

(21) Forming Process for Solder Ball Connection Pattern

A solder ball connection pattern (17) comprising platinum was deposited by sputtering on a rear face side of the ceramic substrate for the thin film electronic component (1) which was subjected to the aforementioned (20).

(22) Removing Process for Resist Layer for Solder Ball Connection Pattern

The resist layer (16) which was no longer necessary after the aforementioned (21) was performed was completely removed by a solvent.

(23) Solder Resist Layer Forming Process

After the protection tape formed in the aforementioned (19) was peeled off, a solder resist layer (10) which selectively excludes by patterning those portions on which a solder ball is formed, was formed on a surface side of the ceramic substrate for a thin film electronic component subjected to the aforementioned (22).

Further, on a rear face side, the dense glass-ceramic mixed layer (33) at a position at which it was exposed by polishing and removing a glaze layer (34) in the aforementioned (19), and which was not covered by the solder ball connection pattern (17) in the aforementioned (21), functions as a solder resist. In this manner, it was not necessary to form a resist layer as used on the surface side.

(24) Solder Ball Forming Process

A solder ball (12) was formed in each of a portion in which the aforementioned resist layer (10) was not formed on the surface side of the ceramic substrate for a thin film electronic component (1) which was subjected to the aforementioned (23) and in a surface of the solder ball connection pattern (17) on the rear face side thereof, to thereby obtain a thin film capacitor (101).

Industrial Applicability

This invention can be widely utilized in electronic component-related fields. The ceramic substrate for a thin film electronic component according to the invention is well adapted for use as a substrate that is to be provided with a thin film electronic component (thin film capacitor or the like) and is particularly advantageous for incorporating a capacitor through a built-in wiring of the substrate. Further, the thin film electronic component according to the invention can advantageously be utilized as a thin film capacitor, a wiring substrate comprising the thin film capacitor or the like.

It should further be apparent to those skilled in the art that various changes in form and detail of the invention as shown and described above may be made. It is intended that such changes be included within the spirit and scope of the claims appended hereto.

This application is based on Japanese Patent Application No. 2003-347539, filed Oct. 6, 2003, incorporated herein by reference in its entirety.

What is claimed is:

1. A thin film electronic component, comprising:
   a ceramic substrate base portion having pores and comprising ceramic;
   a dense glass-ceramic mixed layer formed on the ceramic substrate base portion, said dense glass-ceramic mixed layer comprising glass dispersed in the ceramic of a surface portion of the ceramic substrate so as to fill the pores therein with glass; and
   a thin film conductor layer formed on a surface of the dense glass-ceramic mixed layer;
   said dense glass-ceramic mixed layer is prepared by subjecting a glass layer formed on a surface of the ceramic substrate base portion to heat and pressure treatment to form said dense glass-ceramic mixed layer at the surface of the ceramic substrate and a glass glaze layer on the dense glass-ceramic layer, and then polishing to expose a surface of the dense ceramic-glass mixed layer;
   wherein said surface of the dense glass-ceramic mixed layer has an arithmetic average surface roughness (Ra) of 0.02 μm or less and a maximum height (Ry) of 0.25 μm or less,
   wherein said dense glass-ceramic mixed layer does not have a pore while said ceramic substrate base portion has pores,
   wherein an amount of the glass-filled in pores of the dense glass-ceramic mixed layer is 0.5-50% by mass, and
   wherein the dense glass-ceramic mixed layer has a thickness of 10 μm or more and not greater than 100 μm.

2. The thin film electronic component as claimed in claim 1, wherein the heat-pressure treatment is carried out at 700° C. or higher under a pressure of 1 MPa or higher.

3. The thin film electronic component as claimed in claim 1, wherein the glass constituting the glass layer has a softening point of 750° C. or higher.

4. The thin film electronic component as claimed in claim 1, wherein the glass constituting the glass layer has a yield point of 700° C. or higher.

5. The thin film electronic component as claimed in claim 1, wherein the glass constituting the glass layer comprises, as main components, Si, Al, B, Ca and O.

6. The thin film electronic component as claimed in claim 1, further comprising an interior wiring pattern.

7. The thin film electronic component as claimed in claim 6, wherein one end of the wiring pattern is exposed at a surface of the dense glass-ceramic mixed layer formed on the ceramic substrate base portion and the other end of the wiring pattern is exposed at another surface of the ceramic substrate base portion.

8. The thin film electronic component as claimed in claim 1, further comprising a capacitor portion in which conductor layers for the capacitor and a dielectric layer for the capacitor are alternatingly laminated on the ceramic substrate base portion, such that the dielectric layer for the capacitor is interposed between two opposing conductor layers of the capacitor.

9. The thin film electronic component as claimed in claim 1, said ceramic substrate base portion substantially comprising ceramic.

10. The thin film electronic component as claimed in claim 1, wherein said ceramic substrate base portion comprises alumina as a main ceramic component.

11. A method for producing a thin film electronic component comprising:
    a ceramic substrate base portion having pores and comprising ceramic;
    a dense glass-ceramic mixed layer formed on the ceramic substrate base portion, said dense glass-ceramic mixed layer comprising glass dispersed in the ceramic of a surface portion of the ceramic substrate so as to fill the pores therein with glass; and
    a thin film conductor layer formed on a surface of the dense glass-ceramic mixed layer;
    said dense glass-ceramic mixed layer is prepared by subjecting a glass layer formed on a surface of the ceramic substrate base portion to heat and pressure treatment to form said dense glass-ceramic mixed layer at the surface of the ceramic substrate and a glass glaze layer on the dense glass-ceramic layer, and then polishing to expose a surface of the dense ceramic-glass mixed layer;
    wherein said surface of the dense glass-ceramic mixed layer has an arithmetic average surface roughness (Ra) of 0.02 μm or less and a maximum height (Ry) of 0.25 μm or less,
    wherein said dense glass-ceramic mixed layer does not have a pore while said ceramic substrate base portion has pores, and
    wherein an amount of the glass-filled in pores of the dense glass-ceramic mixed layer is 0.5-50% by mass and
    wherein the dense glass-ceramic mixed layer has a thickness of 10 μm or more and not greater than 100 μm said method comprising, in the stated order: forming a glass layer on a surface of a ceramic substrate base portion having an interior wiring pattern with one end of the interior wiring pattern being exposed on the surface of the ceramic substrate base portion; performing a heat-pressure treatment on the glass layer so as to partly change the glass layer into a dense glass-ceramic mixed layer from which glass is dispersed in a surface portion of the ceramic substrate for the base portion; and polishing the thus-formed dense glass-ceramic mixed layer for flattening the same to thereby expose the dense glass-ceramic mixed layer and the interior wiring pattern.

* * * * *